United States Patent
Yun

(10) Patent No.: US 12,133,405 B2
(45) Date of Patent: Oct. 29, 2024

(54) DISPLAY DEVICE

(71) Applicant: Samsung Display Co., LTD., Yongin-si (KR)

(72) Inventor: Su Yeon Yun, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 446 days.

(21) Appl. No.: 17/505,625

(22) Filed: Oct. 20, 2021

(65) Prior Publication Data

US 2022/0181575 A1 Jun. 9, 2022

(30) Foreign Application Priority Data

Dec. 9, 2020 (KR) ........................ 10-2020-0170973

(51) Int. Cl.
| H10K 50/813 | (2023.01) |
| H10K 59/124 | (2023.01) |
| H10K 59/131 | (2023.01) |
| H10K 77/10 | (2023.01) |
| H10K 102/00 | (2023.01) |

(52) U.S. Cl.
CPC ......... *H10K 50/813* (2023.02); *H10K 59/124* (2023.02); *H10K 59/131* (2023.02); *H10K 77/111* (2023.02); *H10K 2102/311* (2023.02)

(58) Field of Classification Search
CPC .. H10K 59/131; H10K 50/813; H10K 50/822; H10K 59/80521; H10K 59/80515; H10K 59/124; H10K 2102/311; H10K 77/111; G09F 9/301
See application file for complete search history.

(56) References Cited

U.S. PATENT DOCUMENTS

| 10,748,982 B2 | 8/2020 | Hong et al. | |
| 2010/0330338 A1* | 12/2010 | Boyce | H01L 23/4985 |
| | | | 428/156 |
| 2015/0108486 A1* | 4/2015 | Um | G02F 1/1368 |
| | | | 257/72 |
| 2015/0301672 A1 | 10/2015 | Kim et al. | |
| 2019/0181208 A1* | 6/2019 | Wu | H10K 59/8051 |

FOREIGN PATENT DOCUMENTS

| CN | 108877525 A | * 11/2018 | |
| CN | 110648589 A | * 1/2020 | ........... G01D 5/2417 |
| KR | 10-2015-0064337 | 6/2015 | |
| KR | 10-2015-0121383 | 10/2015 | |
| KR | 10-2018-0036845 | 4/2018 | |

* cited by examiner

*Primary Examiner* — Farun Lu
*Assistant Examiner* — Nathan Pridemore
(74) *Attorney, Agent, or Firm* — KILE PARK REED & HOUTTEMAN PLLC

(57) ABSTRACT

A display device includes a substrate including a folding area and a non-folding area disposed adjacent to the folding area; and a pixel electrode disposed on the substrate, wherein the pixel electrode includes a first pixel electrode disposed in the folding area and a second pixel electrode disposed in the non-folding area, and the first pixel electrode includes one or more openings positioned inside from an outermost edge of the first pixel electrode.

17 Claims, 17 Drawing Sheets

DISPLAY DEVICE

CROSS-REFERENCE TO RELATED APPLICATION

This application claims priority from and the benefit of Korean Patent Application No. 10-2020-0170973 filed on Dec. 9, 2020, which is hereby incorporated by reference for all purposes as if fully set forth herein.

BACKGROUND

Field

Embodiments of the invention relate generally to a display device.

Discussion of the Background

The importance of display devices has steadily increased with the development of multimedia technology. In response thereto, various types of display devices such as an organic light emitting display (OLED), a liquid crystal display (LCD) and the like have been used. Such display devices have been variously applied to various mobile electronic devices, for example, portable electronic devices such as a smart phone, a smart watch, and a tablet personal computer (tablet PC).

Recently, a foldable display device has attracted much attention. Since the foldable display device has a wide screen with good portability, it has both advantages of a smartphone and a tablet PC.

A folding operation of the foldable display device may apply stress to each layer constituting the display device. When a pixel electrode is exposed to such stress, plastic deformation or defective film removal may occur.

The above information disclosed in this Background section is only for understanding of the background of the inventive concepts, and, therefore, it may contain information that does not constitute prior art.

SUMMARY

Devices constructed according to illustrative implementations of the invention are capable of reducing stress applied to a conductive layer and an insulating layer disposed in a foldable area of a foldable display device by providing pixel electrodes having a comb-like shape within the foldable area.

Aspects of the present disclosure provide a display device including a conductive layer and an insulating layer that are disposed in a folding area and patterned in a predetermined shape to reduce the stress applied to the conductive layer and the insulating layer during folding.

Additional features of the inventive concepts will be set forth in the description which follows, and in part will be apparent from the description, or may be learned by practice of the inventive concepts.

An embodiment of a display device includes a substrate including a folding area and a non-folding area disposed adjacent to the folding area; and a pixel electrode disposed on the substrate, wherein the pixel electrode includes a first pixel electrode disposed in the folding area and a second pixel electrode disposed in the non-folding area, and the first pixel electrode includes one or more openings positioned in an interior of the first pixel electrode with respect to an outermost edge of the first pixel electrode.

The first pixel electrode may include a plurality of openings, wherein each of the plurality of openings may include a slit connected from the outermost edge to thereby have the first pixel electrode form a comb-like structure Another embodiment of a display device includes a substrate including a folding area and a non-folding area disposed adjacent to the folding area; and a pixel electrode disposed on the substrate, wherein the pixel electrode includes a first pixel electrode disposed in a first pixel disposed in the folding area, and a second pixel electrode disposed in a second pixel disposed in the non-folding area, and when the first pixel and the second pixel represent the same gray scale, a first gamma voltage applied to the first pixel electrode is different from a second gamma voltage applied to the second pixel electrode.

Another embodiment of a display device includes a substrate including a display area including a folding area and a non-folding area disposed adjacent to the folding area, and a non-display area surrounding the display area; and a pixel electrode disposed on the substrate, wherein the substrate includes: a first segment disposed in the folding area and including a plurality of island-like patterns and a plurality of bridge patterns connecting one of the plurality of island-like patterns that are adjacent to each other, and a second segment disposed in the non-folding area defined by the non-display area and the folding area.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

The display device according to one embodiment may include a conductive layer and an insulating layer that are disposed in the folding area and patterned in a predetermined shape to reduce the stress applied to the conductive layer and the insulating layer when the display panel is folded.

For example, stress applied to a pixel electrode may be reduced by including a pixel electrode disposed in the folding area and patterned in a predetermined shape. In this case, the gray scale of the pixel disposed in the folding area may be compensated through a change in the gamma voltage applied to the corresponding pixel electrode.

It should be noted that the effects of the present disclosure are not limited to those described above, and other effects of the present disclosure will be apparent from the following description.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
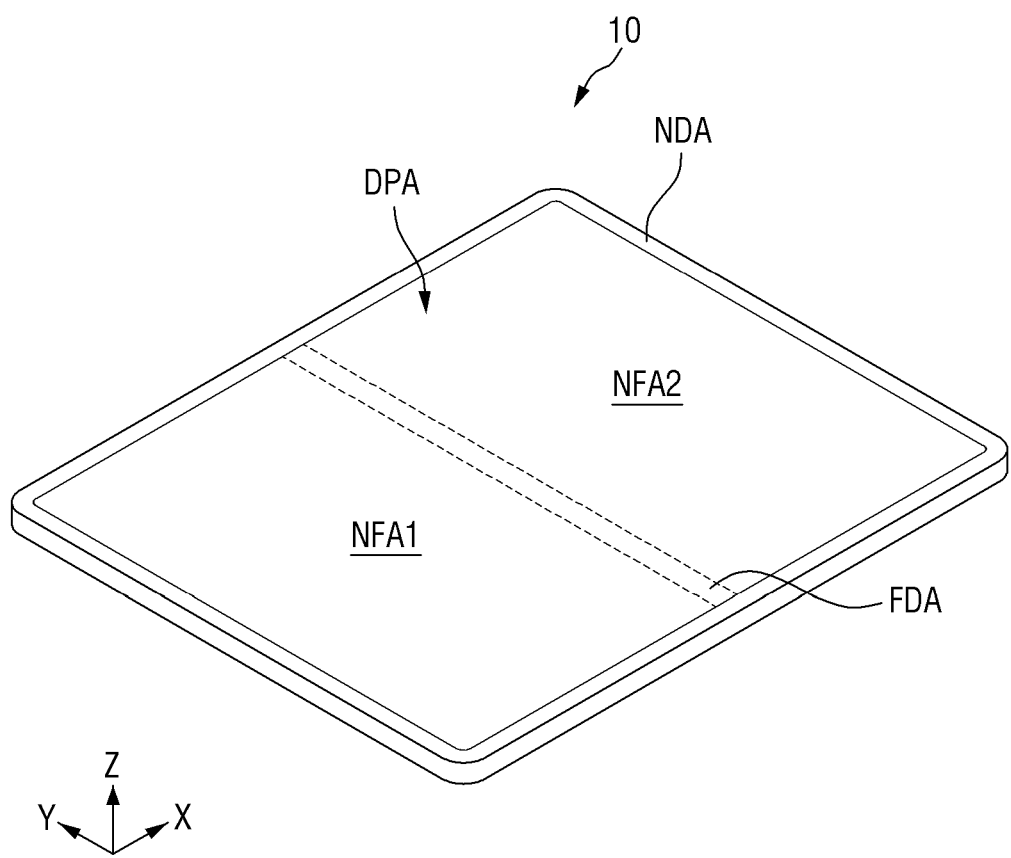
FIG. 1 is a perspective view of a display device according to one embodiment that is constructed according to principles of the invention

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z—axes described hereinbelow, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The present invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

Hereinafter, embodiments will be described in detail with reference to the accompanying drawings.

FIG. 1 is a perspective view of a display device according to one embodiment.

Figure 2:
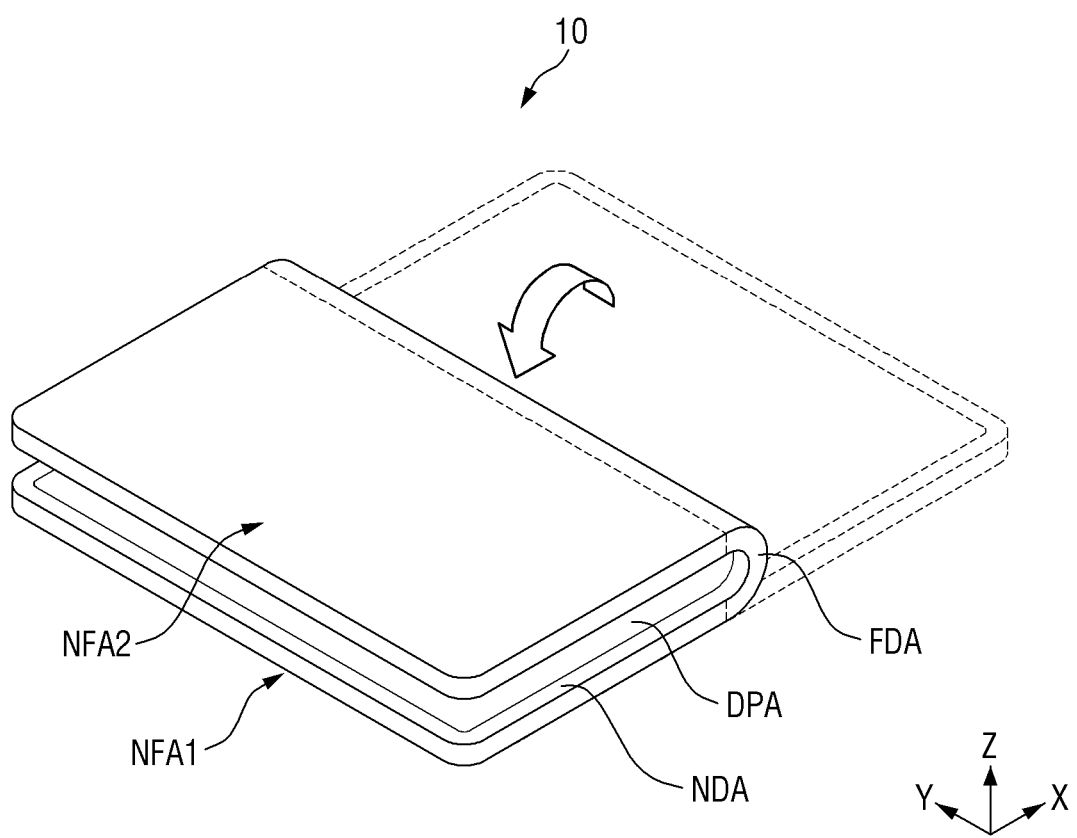
FIG. 2 is a perspective view showing the display device of FIG. 1 in a folded state.

FIG. 2 is a perspective view showing the display device of FIG. 1 in a folded state.

Referring to FIGS. 1 and 2, a display device 10 displays a screen or an image through a display area DPA, and various devices including the display area DPA may be included therein. Examples of the display device 10 may include, but are not limited to, a smartphone, a mobile phone, a tablet personal computer (tablet PC), a personal digital assistant (PDA), a portable multimedia player (PMP), a television, a game machine, a wristwatch-type electronic device, a head-mounted display, a monitor of a personal computer (PC), a laptop computer, a car navigation system, a car's dashboard, a digital camera, a camcorder, an external billboard, an electronic billboard, various medical devices, various inspection devices, various household appliances such as a refrigerator and a washing machine including the display area DPA, an Internet-of-Things (IoT) device, and the like. A typical example of a foldable display device to be described later may be a foldable smartphone, tablet PC or laptop computer, but is not limited thereto.

The display device 10 may have a substantially rectangular shape in plan view. The display device 10 may have a rectangular shape with right-angled or rounded corners in plan view. The display device 10 may include four sides or edges. The display device 10 may include long sides extending in a first direction X and short sides extending in a second direction Y.

The display device 10 may include one surface and the other surface. At least one of one surface or the other surface of the display device 10 may be a display surface. In one embodiment, the display surface may be located on one surface of the display device 10 and display may not be performed on the other surface. Hereinafter, such an embodiment will be mainly described, but the display device may be a double-sided display device in which display is performed on both one surface and the other surface.

The display device 10 may be divided into a display area DPA displaying an image or video and a non-display area NDA disposed around the display area DPA, in plan view, according to whether display is performed.

Figure 7:
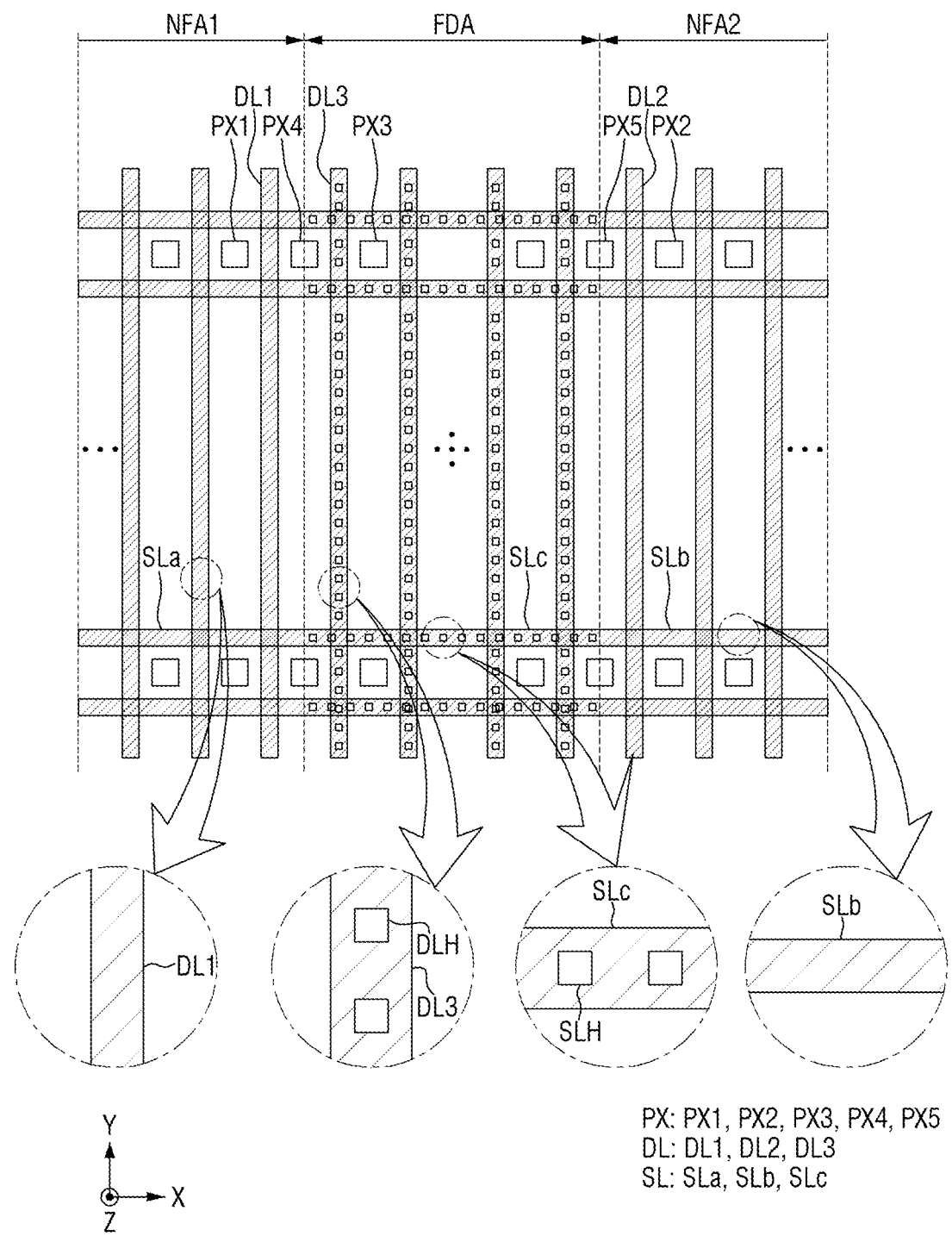
FIG. 7 is a layout diagram of a display panel according to one embodiment.

The display area DPA may include a plurality of pixels PX (see FIG. 7). The pixel PX is a basic unit for displaying a screen. The pixel PX is not limited thereto, but may include a red pixel PX, a green pixel PX, and a blue pixel PX. The pixel PX may further include a white pixel PX. The plurality of pixels PX may be alternately arranged in plan view. For example, the pixels PX may be arranged in a matrix, but the embodiment is not limited thereto.

The non-display area NDA may be disposed around the display area DPA. The non-display area NDA may surround the display area DPA. In one embodiment, the display area DPA may be formed in a rectangular shape, and the non-display area NDA may be disposed around four sides of the display area DPA, but the embodiment is not limited thereto. A black matrix may be disposed in the non-display area NDA to prevent light emitted from adjacent pixels PX from leaking out.

The display device 10 may be a foldable device. As used herein, the term "foldable device" refers to a device which can be folded and is used to denote not only a folded device but also a device that can have both a folded state and an unfolded state. Further, the folding may typically include folding at an angle of about 180 degrees. However, the embodiment is not limited thereto, and it may include a case where the folding angle exceeds 180 degrees or is less than 180 degrees, for example, a case where the folding angle is equal to or greater than 90 degrees and less than 180 degrees, or a case where the folding angle is equal to or greater than 120 degrees and less than 180 degrees. In addition, it may be referred to as a folded state if folding is performed out of the unfolded state, even if complete folding is not performed. For example, even if it is folded at an angle of 90 degrees or less, as long as the maximum folding angle becomes 90 degrees or more, it may be expressed as being in a folded state to distinguish it from the unfolded state. During the folding, the radius of curvature may be 5 mm or less, preferably in the range of 1 mm to 2 mm, or about 1.5 mm, but is not limited thereto.

The display device 10 may be folded with respect to a folding area FDA (or folding axis). The folding area FDA may have a straight linear shape extending in one direction in plan view. Although the drawing illustrates a case where the folding area FDA extends in the second direction Y parallel to the short side of the display device 10, the embodiment is not limited thereto. The folding area FDA may be parallel to the long side or may be inclined with respect to the short side and the long side.

In one embodiment, the folding area FDA of the display device 10 may be determined at a specific location. One folding area FDA may be determined at a specific location in the display device 10.

The display device 10 may be divided into a first non-folding area NFA1 and a second non-folding area NFA2 by the folding area FDA. The first non-folding area NFA1 may be located on one side of the folding area FDA, and the second non-folding area NFA2 may be located on the other side of the folding area FDA. When the folding area FDA is determined at a specific location, the first non-folding area NFA1 and the second non-folding area NFA2 may be specified as an area in which folding is not performed. The specified first non-folding area NFA1 and second non-folding area NFA2 may have the same width, but are not limited thereto. When the folding area FDA is not specified, the first non-folding area NFA1 and the second non-folding area NFA2 may be changed according to a position where the folding area FDA is set.

The display area DPA of the display device 10 may be disposed over both the first non-folding area NFA1 and the second non-folding area NFA2. Further, the display area DPA may be located even in the folding area FDA corresponding to a boundary between the first non-folding area NFA1 and the second non-folding area NFA2. That is, the display area DPA of the display device 10 may be continuously disposed irrespective of boundaries of the non-folding areas NFA1 and NFA2, the folding area FDA and the like. However, the embodiment is not limited thereto, and the display area DPA may be disposed in the first non-folding area NFA1, but the display area DPA may not be disposed in the second non-folding area NFA2. Alternatively, the display area DPA may be disposed in the first non-folding area NFA1 and the second non-folding area NFA2, but the display area DPA may not be disposed in the folding area FDA.

The display device 10 may be folded in an in-folding manner in which the display surface is folded inward such that the inside surfaces face each other (as illustrated in FIG. 2), or folded in an out-folding manner in which the display surface is folded outward. The display device 10 may be folded in only one manner, i.e., an in-folding manner or out-folding manner. Alternatively, both the in-folding and the out-folding may be performed. In the case of the display device 10 in which both in-folding and out-folding are performed, in-folding and out-folding may be performed with respect to the same folding area FDA. Alternatively, it may include a plurality of folding areas FDA, such as a folding line for in-folding only and a folding line for out-folding only, which are used to perform different types of folding.

In one embodiment, the display device 10 may include a display panel, a layer, a panel and a substrate stacked thereon, which have flexibility, and the display device 10 may be folded by folding all the members. In some embodiments, at least a part of the display panel or the members stacked thereon may have a separate shape with respect to the folding area FDA. In this case, the separated member located in the non-folding area may not have a flexible property.

Figure 3:
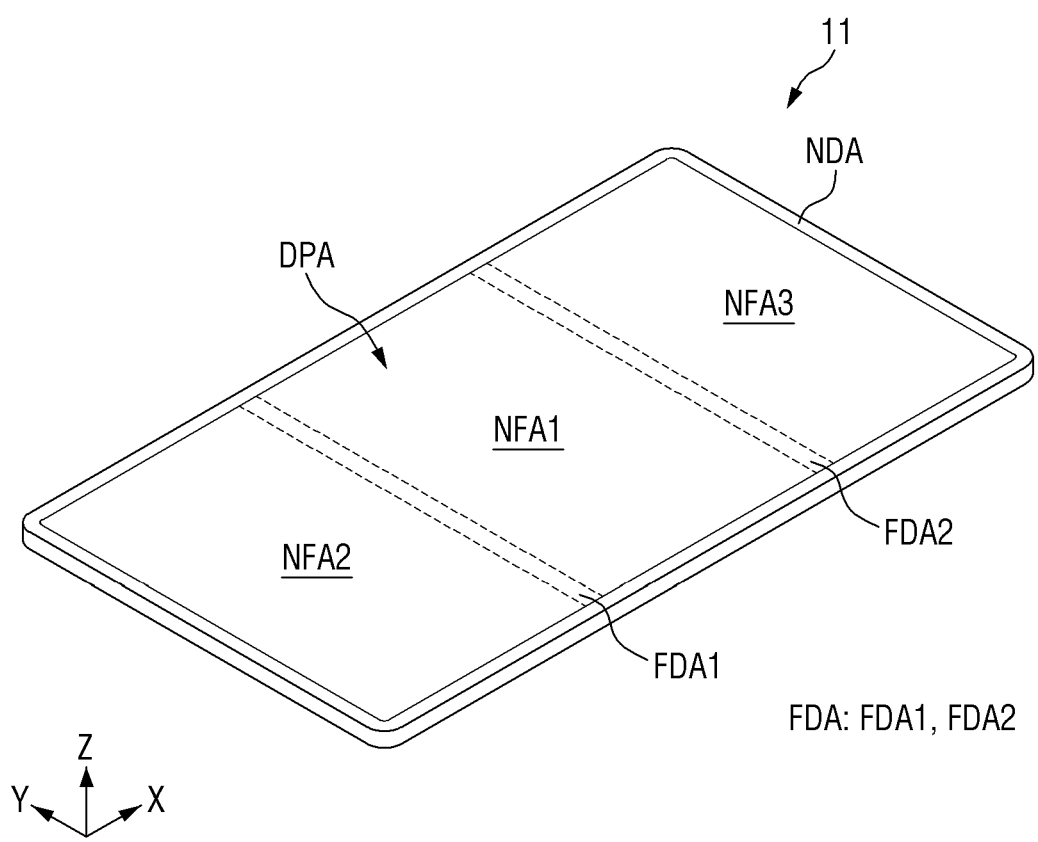
FIG. 3 is a perspective view of a display device according to another embodiment.
Figure 4:
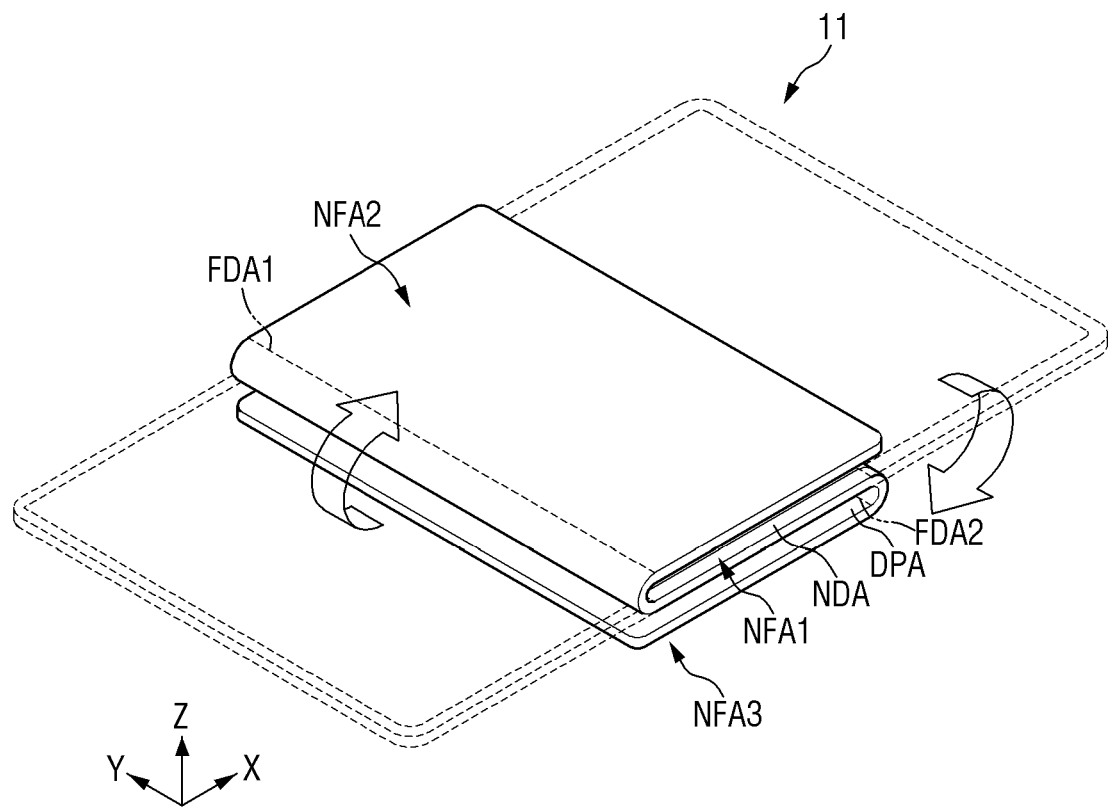
FIG. 4 is a perspective view showing the display device of FIG. 3 in a folded state.

FIG. 3 is a perspective view of a display device according to another embodiment. FIG. 4 is a perspective view showing the display device of FIG. 3 in a folded state.

Referring to FIGS. 3 and 4, a display device 11 according to another embodiment is different from the display device 10 according to one embodiment in that there are a plurality of folding areas FDA that are defined at specific positions. The display device 11 according to the embodiment described with reference to FIGS. 3 and 4 may include two folding areas FDA, but is not limited thereto and may include three or more folding areas FDA.

The folding area FDA of the display device 11 according to the embodiment described with reference to FIGS. 3 and 4 may include a first folding line FDA1 and a second folding line FDA2 that are disposed in parallel with each other. The first folding line FDA1 and the second folding line FDA2 may extend in the second direction Y. The second folding line FDA2 may be positioned on one side of the first folding line FDA1 in the first direction X.

Based on the first folding line FDA1 and the second folding line FDA2, the display device 11 may be distinguished into a first non-folding area NFA1, a second non-folding area NFA2, and a third non-folding area NFA3. Specifically, the first non-folding area NFA1 may be positioned between the first folding line FDA1 and the second folding line FDA2. That is, the first non-folding area NFA1 may be positioned on one side of the first folding line FDA1 in the first direction X and the other side of the second folding line FDA2 in the first direction X.

The second non-folding area NFA2 may be positioned on the other side of the first folding line FDA1 in the first direction X, and the third non-folding area NFA3 may be positioned on one side of the second folding line FDA2 in the first direction X. That is, the first folding line FDA1 may be positioned between the first non-folding area NFA1 and the second non-folding area NFA2, and the second folding line FDA2 may be positioned between the first non-folding area NFA1 and the third non-folding areas NFA3.

When the first folding line FDA1 and the second folding line FDA2 are set at a specific position, the first non-folding area NFA1, the second non-folding area NFA2, and the third non-folding area NFA3 may be specified as areas in which folding is not performed. Each of the specified first non-folding area NFA1, second non-folding area NFA2, and third non-folding area NFA3 may have the same width, but is not limited thereto. When the first folding line FDA1 and the second folding line FDA2 are not specified, the areas of the first non-folding area NFA1, the second non-folding area NFA2, and the third non-folding area NFA3 may be changed according to the positions where the first folding line FDA1 and the second folding line FDA2 are set.

The display area DPA of the display device 11 may be disposed over all of the first non-folding area NFA1, the second non-folding area NFA2, and the third non-folding area NFA3. Furthermore, the display area DPA may also be positioned on the first folding line FDA1 and the second folding line FDA2. That is, the display area DPA of the display device 11 may be continuously disposed regardless of the boundary of the non-folding areas NFA1, NFA2, and NFA3, the folding lines FDA1 and FDA2, or the like.

In the display device 11, the first folding line FDA1 and the second folding line FDA2 may be folded in an in-folding manner in which the display surface faces inward and faces to each other, or may be folded in an out-folding manner in which the display surface faces outward.

In the display device 11, the first folding line FDA1 and the second folding line FDA2 may be folded using only one of an in-folding manner and an out-folding manner, or may be folded by performing both in-folding and out-folding. In the case of the display device 11 in which both in-folding and out-folding are performed, in-folding and out-folding may be performed with respect to the same first folding line FDA1 and second folding line FDA2.

In still another embodiment, the location of the folding area FDA may not be specified in the display device 10 and may be freely set in various areas.

Hereinafter, a description to be described below will be described based on the display device 10 including one folding area FDA illustrated in FIGS. 1 and 2, but is not limited thereto, and a description to be described later may also be applied to the display device 11 including two folding areas FDA illustrated in FIGS. 3 and 4 or the display device 10 including three or more folding areas FDA.

Figure 5:
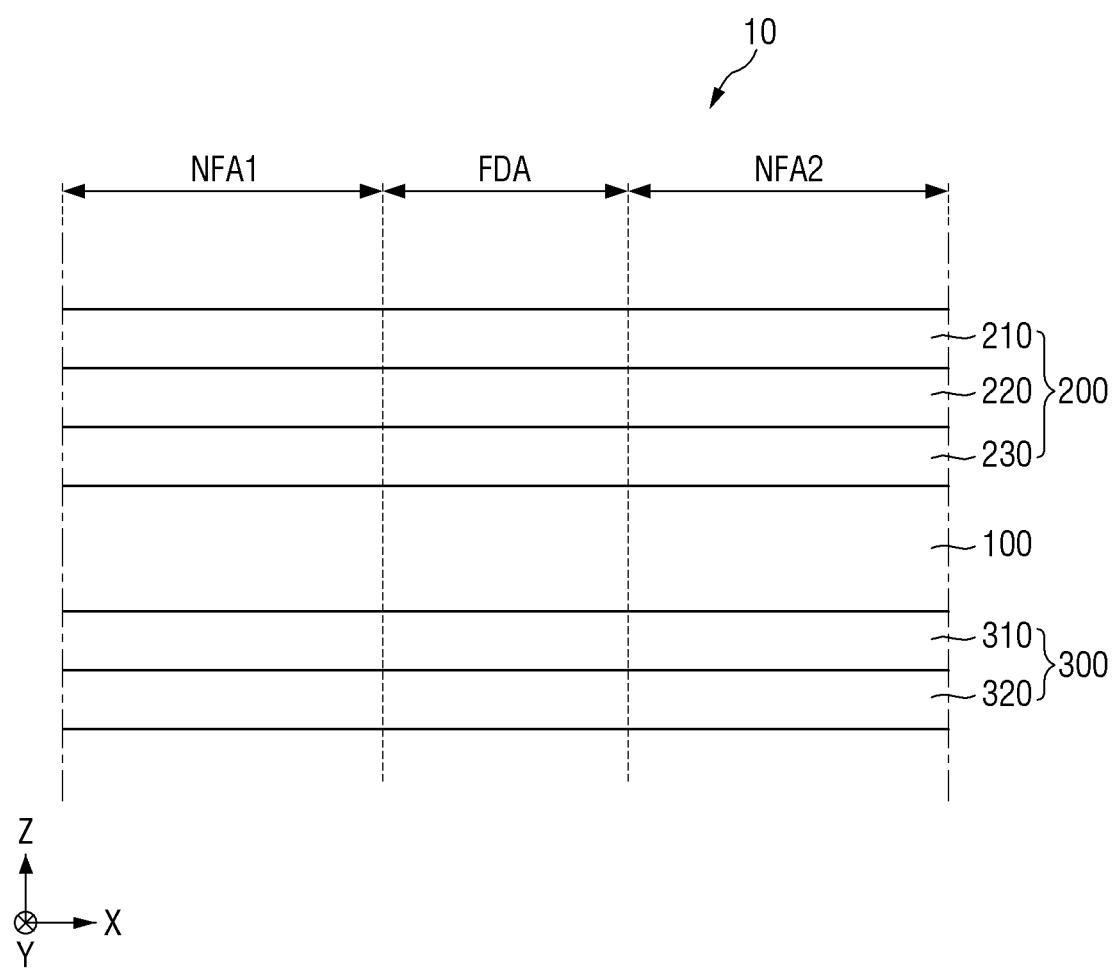
FIG. 5 is a cross-sectional view of a display device in an unfolded state according to one embodiment.
Figure 6:
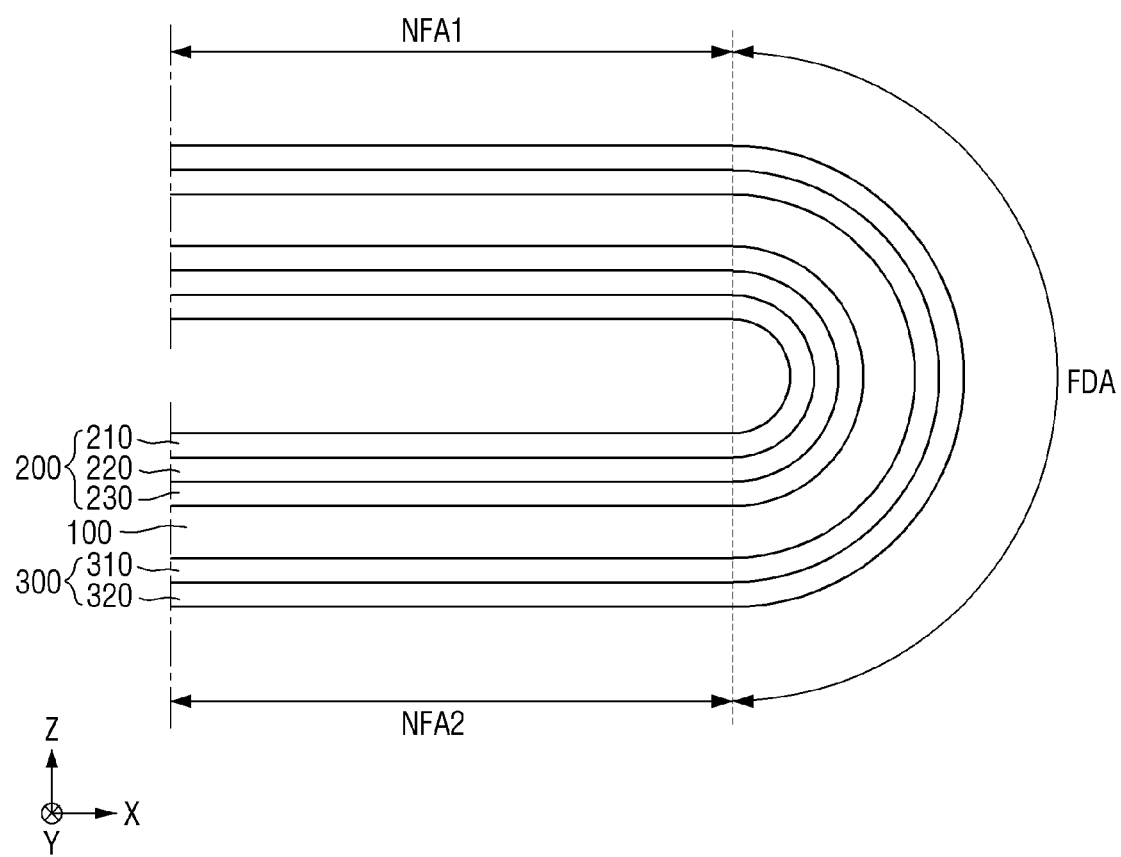
FIG. 6 is a cross-sectional view of a display device in a folded state according to one embodiment.

FIG. 5 is a cross-sectional view of a display device in an unfolded state according to one embodiment. FIG. 6 is a cross-sectional view of a display device in a folded state according to one embodiment.

Referring to FIGS. 5 and 6, the display device 10 may include a display panel 100, a front laminated structure 200 on the front side of the display panel 100, and a rear laminated structure 300 on the rear side of the display panel 100. Here, the front side of the display panel 100 refers to a side on which the display panel 100 displays a screen, and the rear side refers to the opposite side of the front side. One surface of the display panel 100 is located on the front side, and the other surface of the display panel 100 is located on the rear side.

The display panel 100 is a panel for displaying a screen or an image. Examples of the display panel 100 may include not only a self-light emitting display panel such as an organic light emitting display (OLED) panel, an inorganic electroluminescence (EL) display panel, a quantum dot light emitting display (QED) panel, a micro-LED display panel, a nano-LED display panel, a plasma display panel (PDP), a field emission display (FED) panel and a cathode ray tube (CRT) display panel, but also a light receiving display panel such as a liquid crystal display (LCD) panel and an electrophoretic display (EPD) panel. Hereinafter, an organic light emitting display panel will be described as an example of the display panel 100, and the organic light emitting display panel applied to the embodiment will be simply referred to as the display panel 100 unless special distinction is required. However, the embodiment is not limited to the organic light emitting display panel, and other display panels mentioned above or known in the art may be applied within the scope of the same technical ideas.

The front laminated structure 200 may be disposed on the front side of the display panel 100. The front laminated structure 200 may include a polarization member 230, an impact absorbing layer 220, and a cover window 210 sequentially stacked forward from the display panel 100.

The polarization member 230 may polarize light passing therethrough. The polarization member 230 may serve to reduce the reflection of external light. In one embodiment, the polarization member 230 may be a polarizing film. The polarizing film may include a polarizing layer and protective members sandwiching the polarizing layer therebetween.

The impact absorbing layer 220 may be disposed in front of the polarization member 230. The impact absorbing layer 220 may serve to protect a structure such as a lower display panel from external impact. In one embodiment, the impact absorbing layer 220 may include a polymer film.

The cover window 210 may be disposed in front of the impact absorbing layer 220. The cover window 210 serves to protect the display panel 100. The cover window 210 may be made of a transparent material. The cover window 210 may include, for example, glass or plastic.

In some embodiments, the front laminated structure 200 may further include a front bonding member that bonds each of the members adjacently stacked. For example, the front bonding member may be disposed between the cover window 210 and the impact absorbing layer 220 and between the impact absorbing layer 220 and the polarization member 230 to couple therebetween. The front bonding member may be a pressure sensitive adhesive (PSA) layer.

The rear laminated structure 300 is disposed on the rear side of the display panel 100. The rear laminated structure 300 may include a cushion layer 310 and a metal plate 320 sequentially stacked from the display panel 100 to the rear.

The cushion layer 310 may absorb external impact and prevent the display panel 100 from being damaged. The cushion layer 310 may be formed of a single layer or a plurality of laminated layers. The cushion layer 310 may include, for example, a material having elasticity such as polyurethane or polyethylene resin. In one embodiment, the cushion layer 310 may be made of a foam material similar to a sponge.

The metal plate 320 may be disposed on the rear side of the cushion layer 310. The metal plate 320 may be a support member for bonding the display device 10 to a case. The metal plate 320 may be made of a material having rigidity. In one embodiment, the metal plate 320 may be made of a single metal or metal alloy such as stainless steel (SUS).

Figure 8:
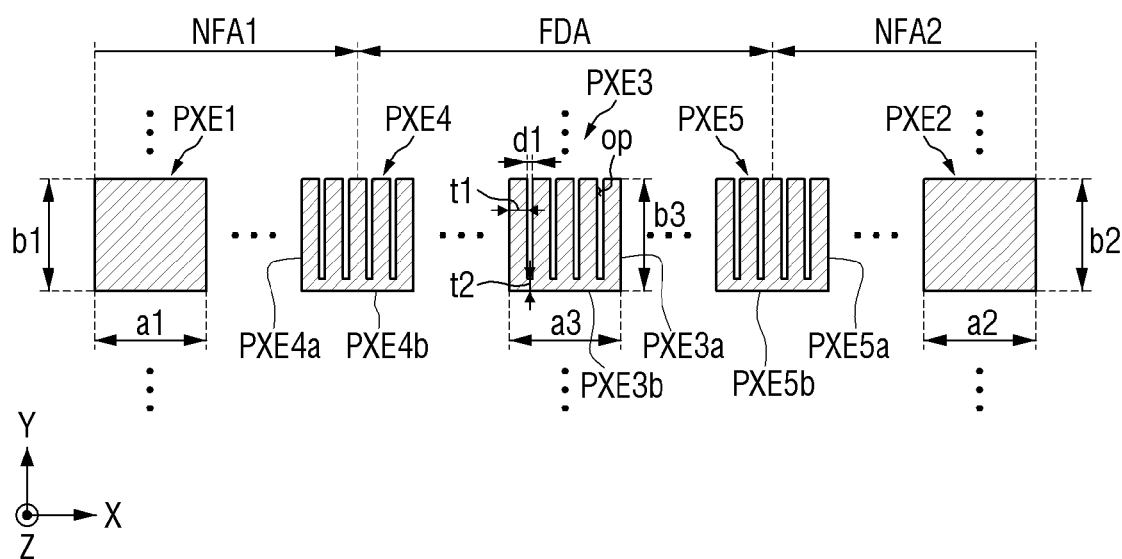
FIG. 8 is a layout diagram of pixel electrodes of a display panel according to one embodiment.

FIG. 7 is a layout diagram of a display panel according to one embodiment. FIG. 8 is a layout diagram of pixel electrodes of a display panel according to one embodiment.

Referring to FIGS. 7 and 8, the display panel 100 may include a plurality of pixels PX, a plurality of scan wires SL, and a plurality of data wires DL.

The plurality of pixels PX may be arranged in the first direction X and the second direction Y. That is, the plurality of pixels PX may be arranged in a matrix.

The plurality of data wires DL extending in the second direction Y may be disposed on one side and the other side of each pixel PX in the first direction X, and a plurality of scan wires SL extending in the first direction X may be disposed on one side and the other side of each pixel PX in the second direction Y.

The plurality of pixels PX may include a first pixel PX1 disposed in the first non-folding area NFA1, a second pixel PX2 disposed in the second non-folding area NFA2, and a third pixel PX3 disposed in the folding area FDA. In some cases, the plurality of pixels PX may further include a fourth pixel PX4 disposed across the first non-folding area NFA1 and the folding area FDA and a fifth pixel PX5 disposed across the second non-folding area NFA2 and the folding area FDA. When the display panel 100 is folded, the first pixel PX1 and the second pixel PX2 may not be folded. On the other hand, when the display panel 100 is folded, the third pixel PX3 may be folded, and the fourth and fifth pixels PX4 and PX5 may be partially folded.

Each pixel PX may include a pixel electrode PXE. A first pixel electrode PXE1 may be disposed in the first pixel PX1, a second pixel electrode PXE2 may be disposed in the second pixel PX2, and a third pixel electrode PXE3 may be disposed in the third pixel PX3, a fourth pixel electrode PXE4 may be disposed in the fourth pixel PX4, and a fifth pixel electrode PXE5 may be disposed in the fifth pixel PX5. As will be described later, the pixel electrode PXE may be an anode electrode constituting a light emitting element (see 'EMD' in FIG. 9), and may be disposed for each pixel PX. The position of the pixel electrode PXE on the stacked structure of the display panel 100 will be described in detail with reference to FIG. 9.

The first pixel electrode PXE1 and the second pixel electrode PXE2 may be tubular electrodes having a rectangular shape in plan view. The first pixel electrode PXE1 and the second pixel electrode PXE2 may have the same planar shape. That is, a length a1 of the first pixel electrode PXE1 in the first direction X and a length a2 of the second pixel electrode PXE2 in the first direction X may be the same. In addition, a length b1 of the first pixel electrode PXE1 in the second direction Y and a length b2 of the second pixel electrode PXE2 in the second direction Y may be the same.

However, the planar shape of the first pixel electrode PXE1 and the second pixel electrode PXE2 is not limited thereto, and may have a different polygonal shape, a circular shape, and an elliptical shape.

The third pixel electrode PXE3 may have a pattern having a different shape from the shapes of the first and second pixel electrodes PXE1 and PXE2. The outermost edge of the third pixel electrode PXE3 may define the appearance of the third pixel electrode PXE3. The third pixel electrode PXE3 may include one or more openings disposed inside from an outermost edge defining an appearance, to thereby have a comb-like structure. Put in another way, the third pixel electrode PXE3 may include one or more openings positioned in an interior of the first pixel electrode with respect to an outermost edge of the first pixel electrode PXE3.

The surface area of the third pixel electrode PXE3 may be smaller than the surface areas of the first pixel electrode PXE1 and the second pixel electrode PXE2. The surface area of the first to third pixel electrodes PXE1, PXE2, and PXE3 may mean an area of one side surface in the third direction Z. However, the embodiment is not limited thereto, and the surface area of the third pixel electrode PXE3 may be greater than or equal to the surface areas of the first pixel electrode PXE1 and the second pixel electrode PXE2.

In the display panel 100 according to one embodiment, the third pixel electrode PXE3 may include an extension portion PXE3a of the third pixel electrode PXE3 extending in the second direction Y and a connection portion PXE3b of the third pixel electrode PXE3 extending in the first direction X. There are a plurality of extension portions PXE3a, which may be arranged along the first direction X. The other end of each extension portion PXE3a in the second direction Y may be coupled to each other by the connection portion PXE3b. That is, the extension portion PXE3a may have a shape extending from the connection portion PXE3b to one side of the second direction Y.

In one embodiment, the opening included in the third pixel electrode PXE3 may have a shape of a slit OP that is connected from an outermost edge defining an appearance and has a recessed shape. The slit OP may be defined by the extension portion PXE3a and the connection portion PXE3b, adjacent to each other, of the third pixel electrode PXE3.

A width t1 of the extension portion PXE3a may be greater than a width t2 of the connection portion PXE3b. The width t1 of the extension portion PXE3a may mean a length of the extension portion PXE3a in the first direction X. The width t2 of the connection portion PXE3b may mean a length of the connection portion PXE3b in the second direction Y. However, the embodiment is not limited thereto, and the width t1 of the extension portion PXE3a may be less than or equal to the width t2 of the connection portion PXE3b.

A distance d1 between the extension portions PXE3a adjacent to each other among the plurality of extension portions PXE3a may be substantially the same. The distance d1 between the extension portions PXE3a adjacent to each other may be smaller than the width t1 of the extension portions PXE3a. In addition, the distance d1 between the extension portions PXE3a adjacent to each other may be larger than the width t2 of the connection portion PXE3b. However, the embodiment is not limited thereto.

A length a3 of the connection portion PXE3b in the first direction X may be the same as the length a1 of the first pixel electrode PXE1 in the first direction X and the length a2 of the second pixel electrode PXE2 in the first direction X. In addition, a length b3 of the extension portion PXE3a in the second direction Y may be the same as the length b1 of the first pixel electrode PXE1 in the second direction Y and the length b2 of the second pixel electrode PXE2 in the second direction Y.

Accordingly, the surface area of the third pixel electrode PXE3 may be smaller than the surface areas of the first and second pixel electrodes PXE1 and PXE2. Accordingly, due to the relatively small surface area of the third pixel electrode PXE3, when the same voltage is applied to the first to third pixel electrodes PXE1, PXE2, and PXE3, the third pixel PX3 may represent a gray scale lower than the gray scales of the first and second pixels PX1 and PX2. Accordingly, it is necessary to compensate the gray scale of the third pixel PX by increasing the voltage applied to the third pixel electrode PXE3 disposed in the folding area FDA. A detailed description thereof will be described later with reference to FIG. 11.

The fourth and fifth pixel electrodes PXE4 and PXE5 may have the same structure as the third pixel electrode PXE3. That is, the fourth pixel electrode PXE4 may include an extension portion PXE4a of the fourth pixel electrode PXE4 extending in the second direction Y and a connection portion PXE4b of the fourth pixel electrode PXE4 extending in the first direction X. The fifth pixel electrode PXE5 may include an extension portion PXE5a of the fifth pixel electrode PXE5 extending in the second direction Y and a connection portion PXE5b of the fifth pixel electrode PXE5 extending in the first direction X.

The plurality of scan wires SL may extend in the first direction X and may be arranged in the second direction Y. The scan wire SL may be connected to a scan driver (see 'SCD' in FIG. 11) to be applied with a scan signal provided from a scan driver SCD.

Each scan wire SL may include a first non-folding scan wire portion SLa disposed in the first non-folding area NFA1, a second non-folding scan wire portion SLb disposed in the second non-folding area NFA2, and a folding scan wire portion SLc disposed in the folding area FDA. That is, the folding scan wire portion SLc may be disposed between the first non-folding scan wire portion SLa and the second non-folding scan wire portion SLb. The other side of the folding scan wire portion SLc in the first direction X may be connected to the first non-folding scan wire portion SLa, and one side of the folding scan wire portion SLc in the first direction X may be connected to the second non-folding scan wire portion SLb.

When the display panel 100 is folded with respect to the folding axis extending in the second direction Y, in the scan wire SL, the folding scan wire portion SLc may be folded and the first non-folding scan wire portion SLa and the second non-folding scan wire portion SLb may not be folded. That is, the folding scan wire portion SLc may be an area that is folded in the scan wire SL when the display panel 100 is folded.

The first non-folding scan wire portion SLa and the second non-folding scan wire portion SLb may extend in the first direction X, and may be lines constituted with a tubular electrode that does not include an opening.

The folding scan wire portion SLc may include a plurality of scan openings SLH. Each scan opening SLH may penetrate the folding scan wire portion SLc. The inside of the scan opening SLH may be filled with an organic material. For example, the inside of the scan opening SLB may be filled with a via layer (see '165' in FIG. 9) to be described later. The planar shape of each scan opening SLH may be rectangular, circular, or elliptical, but is not limited thereto and may have other polygonal shapes. The plurality of scan openings SLH may be arranged in a line along the first direction X. However, the embodiment is not limited thereto and may be arranged by configuring a plurality of columns.

The folding scan wire portion SLc may include the plurality of scan openings SLH filled with a via layer 165 made of an organic material, so that stress applied to the scan wire SL may be reduced when the display panel 100 is folded.

The plurality of data wires DL may extend in the second direction Y and may be arranged in the first direction X. Each data wire DL may be electrically connected to a display driving circuit (not illustrated) to be applied with a data signal provided from the display driving circuit (not illustrated).

The plurality of data wires DL may include a first data wire DL1 disposed in the first non-folding area NFA1, a second data wire DL2 disposed in the second non-folding area NFA2, and a third data wire DL3 disposed in the folding area FDA.

The first data wire DL1 and the second data wire DL2 may extend in the second direction Y and may be wires constituted with a tubular electrode that does not include an opening.

The third data wire DL3 may include a plurality of data openings DLH. Each data opening DLH may penetrate the third data wire DL3. Like the scan opening SLH described above, the inside of the data opening DLH may be filled with an organic material to be described later. For example, the inside of the data opening DLH may be filled with the via layer 165 to be described later. The planar shape of the opening DLH may be rectangular, circular, or elliptical, but is not limited thereto and may have other polygonal shapes. The plurality of data openings DLH may be arranged in a line along the second direction Y. However, the embodiment is not limited thereto and may be arranged by configuring a plurality of columns.

The third data wire DL3 may include the plurality of data openings DLH filled with the via layer 165 made of an organic material, so that stress applied to the third data wire DL3 disposed in the folding area FDA may be reduced when the display panel 100 is folded.

Figure 9:
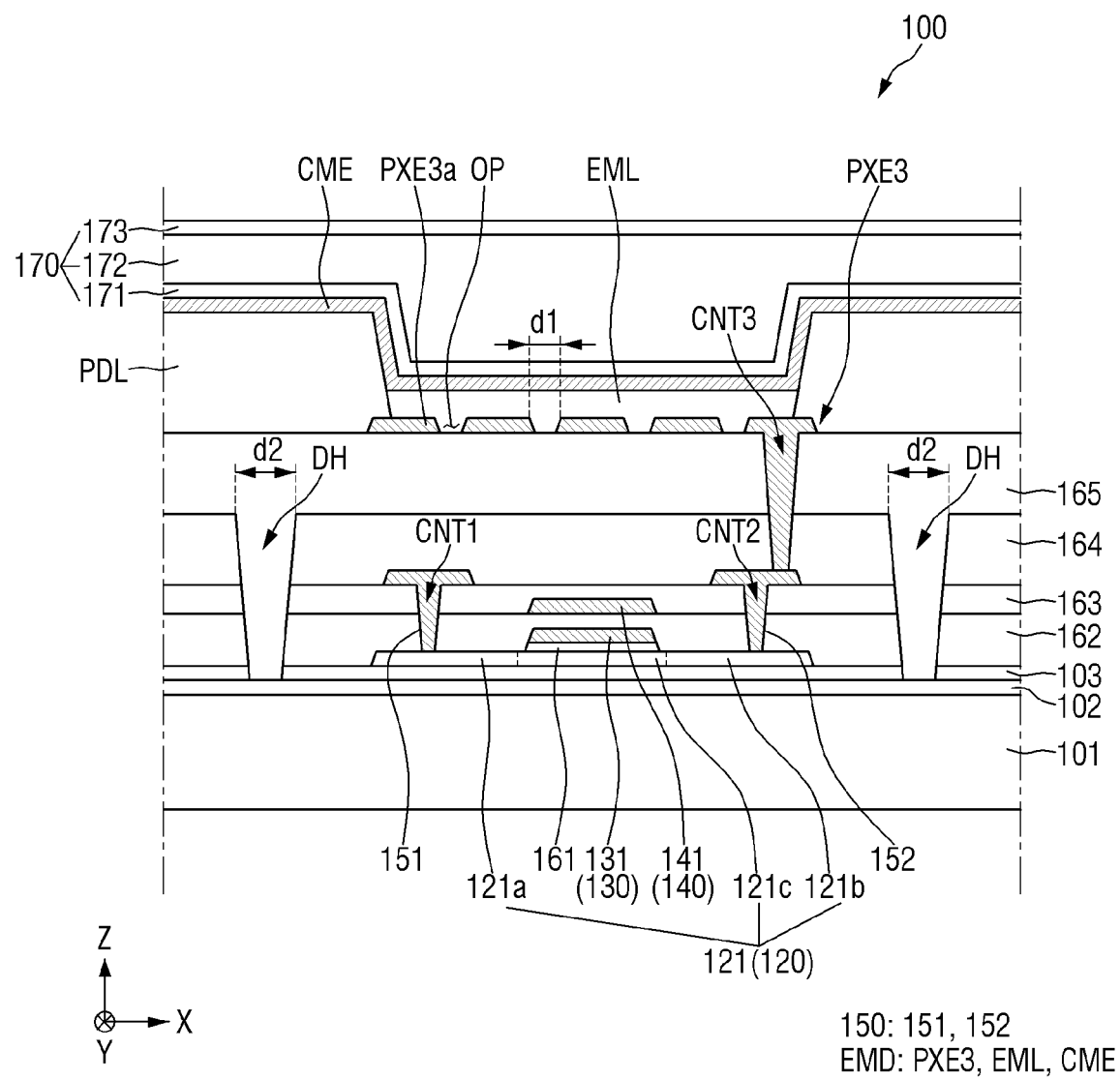
FIG. 9 is a cross-sectional view illustrating an unfolded state of a folding area of a display panel according to one embodiment.
Figure 10:
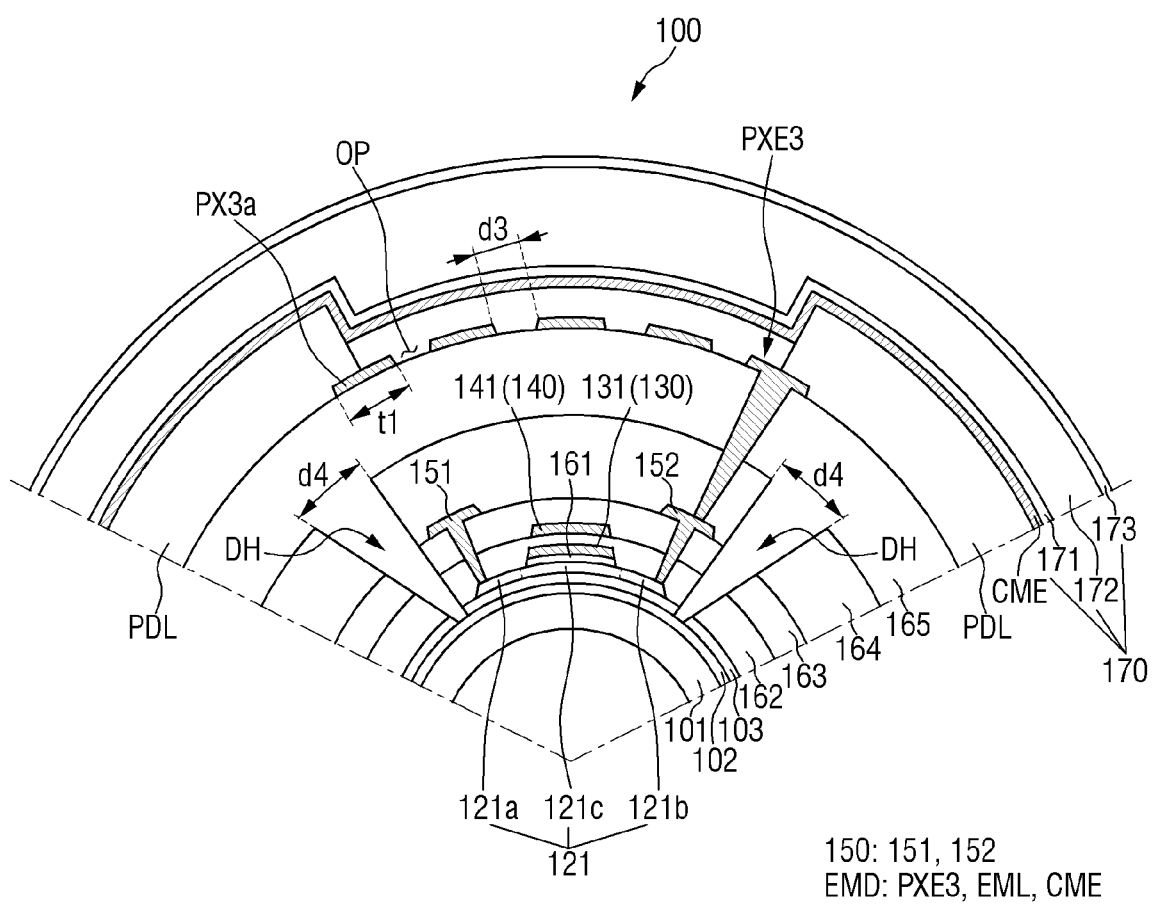
FIG. 10 is a cross-sectional view illustrating a folded state of a folding area of a display panel according to one embodiment.

FIG. 9 is a cross-sectional view illustrating an unfolded state of a folding area of a display panel according to one embodiment. FIG. 10 is a cross-sectional view illustrating a folded state of a folding area of a display panel according to one embodiment.

The cross-sectional views of FIGS. 9 and 10 are cross-sectional views of one pixel disposed in the folding area FDA of the display panel 100, but the cross-sectional view of one pixel disposed in the non-folding areas NFA1 and NFA2 may have the same structure except for including the pixel electrodes PXE1 and PXE2 that are not patterned.

Referring to FIGS. 9 and 10 with FIGS. 7 and 8, the display panel 100 may include a substrate 101, a barrier layer 102, a buffer layer 103, a semiconductor layer 120, a first interlayer insulating layer 161, a first conductive layer 130, a second interlayer insulating layer 162, a second conductive layer 140, a third interlayer insulating layer 163, a third conductive layer 150, a fourth interlayer insulating layer 164, the via layer 165, the third pixel electrode PXE3, a pixel defining layer PDL, a light emitting layer EML, a common electrode CME, and a thin film encapsulation layer 170 that may be sequentially disposed in the folding area FDA. Each of the layers described above may consist of a single layer, or a stack of multiple layers. Other layers may be further disposed between the layers.

The substrate 101 supports the respective layers disposed thereon. The substrate 101 may be made of, for example, an insulating material such as a polymer resin. Without being limited thereto, the substrate 101 may include a metal material.

The substrate 101 may be a flexible substrate that can be bent, folded or rolled. An example of the material of the flexible substrate may be polyimide (PI), but is not limited thereto.

A transparent substrate may be used when the organic light emitting display device is a bottom emission type or a double-sided emission type. When the organic light emitting display device is a top emission type, in addition to a transparent substrate, a translucent or opaque substrate may be applied.

The barrier layer 102 may be disposed on the substrate 101. The barrier layer 102 can prevent diffusion of impurity ions, prevent permeation of moisture or external air, and perform a surface planarization function. The barrier layer 102 may include silicon nitride, silicon oxide, silicon oxynitride, or the like. The barrier layer 102 may be omitted depending on the type of the substrate 101, process conditions, and the like.

The buffer layer 103 may be disposed on the barrier layer 102. The buffer layer 103 may include at least one of silicon nitride, silicon oxide, or silicon oxynitride. The buffer layer 103 may be omitted depending on the type of the substrate 101, process conditions, and the like.

The semiconductor layer 120 may be disposed on the buffer layer 103. The semiconductor layer 120 may include semiconductor patterns 121a, 121b, and 121c.

The semiconductor patterns 121a, 121b, and 121c may include the channel region 121c overlapping a first gate electrode 131 to be described later on the upper side in the thickness direction, and the first source/drain region 121a and the second source/drain region 121b that are disposed on one side and the other side of the channel region 121c, respectively. The first and second source/drain regions 121a and 121b may include a plurality of carrier ions and may have a high conductivity and low electric resistance in comparison with the channel region 121c. The semiconductor layer 120 may be made of polycrystalline silicon, monocrystalline silicon, amorphous silicon, or the like.

The first interlayer insulating layer 161 may be disposed on the semiconductor layer 120. The first interlayer insulating layer 161 may be a gate insulating layer. The first interlayer insulating layer 161 may be disposed to overlap the first gate electrode 131 to be described later. The edge of the first interlayer insulating layer 161 may be aligned with the edge of the first gate electrode 131.

The first interlayer insulating layer 161 may include a silicon compound, a metal oxide, or the like. For example, the first interlayer insulating layer 161 may include silicon oxide, silicon nitride, silicon oxynitride, aluminum oxide, tantalum oxide, hafnium oxide, zirconium oxide, titanium oxide, or the like. These may be used alone or in combination with each other.

The first conductive layer 130 may be disposed on the first interlayer insulating layer 161. The first conductive layer 130 is a gate conductive layer and may include the first gate electrode 131. The first gate electrode 131 may be electrically connected to the above-described scan wire SL to be applied with a scan signal from the scan wire SL. For example, the first gate electrode 131 disposed in the folding area FDA may be electrically connected to the folding scan wire portion SLc to be applied with a scan signal.

The first conductive layer 130 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Tr), chromium (Cr), calcium (Ca), titanium (Ti), tantalum (Ta), tungsten (W) and copper (Cu).

The second interlayer insulating layer 162 may be disposed on the first conductive layer 130. The second interlayer insulating layer 162 may be disposed generally over the entire surface of the substrate 101. The second interlayer insulating layer 162 may include a silicon compound, a metal oxide, or the like. For example, the second interlayer insulating layer 162 may include silicon oxide, silicon nitride, silicon oxynitride, aluminum oxide, tantalum oxide, hafnium oxide, zirconium oxide, titanium oxide, or the like. These may be used alone or in combination with each other.

The second conductive layer 140 may be disposed on the second interlayer insulating layer 162. The second conductive layer 140 may include a second gate electrode 141. The second gate electrode 141 may form a storage capacitor together with the first gate electrode 131. That is, the first electrode of the storage capacitor (not illustrated) may be the first gate electrode 131, and the second electrode may be the second gate electrode 141.

The third interlayer insulating layer 163 may be disposed on the second conductive layer 140. The third interlayer insulating layer 163 may be disposed generally over the entire surface of the substrate 101. The third interlayer insulating layer 163 may include a silicon compound, a metal oxide, or the like. For example, the second interlayer insulating layer 162 may include silicon oxide, silicon nitride, silicon oxynitride, aluminum oxide, tantalum oxide, hafnium oxide, zirconium oxide, titanium oxide, or the like. These may be used alone or in combination with each other.

The third conductive layer 150 may be disposed on the third interlayer insulating layer 163. The third conductive layer 150 is a data conductive layer and may include a first source/drain electrode 151 and a second source/drain electrode 152.

The first source/drain electrode 151 may be electrically connected to the first source/drain region 121a through a first contact hole CNT1 penetrating the second interlayer insulating layer 162 and the third interlayer insulating layer 163.

The second source/drain electrode 152 may be electrically connected to the second source/drain region 121b through a second contact hole CNT2 penetrating the second interlayer insulating layer 162 and the third interlayer insulating layer 163.

One of the first source/drain electrode 151 and the second source/drain electrode 152 may be a source electrode, and the other one may be a drain electrode. Accordingly, any one of the first source/drain electrode 151 and the second source/drain electrode 152 may be electrically connected to the above-described data wire DL to be applied with a data signal from the data wire DL. For example, when the first source/drain electrode 151 and the second source/drain electrode 152 are disposed in the folding area FDA, any one of the first source/drain electrode 151 and the second source/drain electrode 152 may be applied with a data signal from the third data wire DL3.

The first source/drain electrode 151 and the second source/drain electrode 152 may constitute a thin film transistor TFT together with the semiconductor layer 120 and the first gate electrode 131 described above.

The third conductive layer 150 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The fourth interlayer insulating layer 164 may be disposed on the third conductive layer 150. The fourth interlayer insulating layer 164 may be disposed generally over the entire surface of the substrate 101. The second interlayer insulating layer 162 may include a silicon compound, a metal oxide, or the like. For example, the second interlayer insulating layer 162 may include silicon oxide, silicon nitride, silicon oxynitride, aluminum oxide, tantalum oxide, hafnium oxide, zirconium oxide, titanium oxide, or the like. These may be used alone or in combination with each other.

The via layer 165 may be disposed on the fourth interlayer insulating layer 164. The via layer 165 may be disposed generally over the entire surface of the substrate 101. The via layer 165 may be formed of an organic layer including an organic insulating material. In the case where the via layer 165 is formed as an organic layer, the top surface thereof may be partially flat despite a lower step.

In the folding area FDA of the display panel 100, a dummy hole DH penetrating the buffer layer 103, the second interlayer insulating layer 162, the third interlayer insulating layer 163, and the fourth interlayer insulating layer 164 may be disposed. The via layer 165 may fill the inside of the dummy hole DH. A detailed description of the dummy hole DH will be described later.

The via layer 165 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

In the folding area FDA, the third pixel electrode PXE3 may be disposed on the via layer 165. The third pixel electrode PXE3 may be an anode electrode. The third pixel electrode PXE3 may be separately disposed for each pixel PX. The third pixel electrode PXE3 may be electrically connected to the second source/drain electrode 152 through a third contact hole CNT3 penetrating the fourth interlayer insulating layer 164 and the via layer 165.

As described above, the third pixel electrode PXE3 may include the plurality of extension portions PXE3a. The width t1 of each extension portion PXE3a may be substantially constant. The third pixel electrode PXE3 may further include a plurality of slits OP disposed between the extension portions PXE3a adjacent to each other. The width of each slit OP in the first direction X may be the same as the distance d1 between the extension portions PXE3a adjacent to each other among the plurality of extension portions PXE3a. The inside of the slit OP of the third pixel electrode PXE3 may be filled with the light emitting layer EML to be described later.

The distance d1 between the extension portions PXE3a adjacent to each other among the plurality of extension portions PXE3a in the unfolded state may be smaller than a distance d3 between the extension portions PXE3a adjacent to each other among the plurality of extension portions PXE3a in the folded state of the display panel 100 with respect to the folding axis extending in the second direction Y. However, the embodiment is not limited thereto, and the distance d1 between the extension portions PXE3a adjacent to each other among the plurality of extension portions PXE3a in the unfolded state may be the same as the distance d3 between the extension portions PXE3a adjacent to each other among the plurality of extension portions PXE3a in the folded state of the display panel 100 with respect to the folding axis extending in the second direction Y.

The third pixel electrode PXE3 may have a stacked structure formed by stacking a material layer having a high work function, such as indium tin oxide (ITO), indium zinc oxide (IZO), zinc oxide (ZnO) and indium oxide (In2O3), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but is not limited thereto. The layer having a high work function may be disposed above the reflective material layer and disposed closer to the light emitting layer EML. The third pixel electrode PXE3 may have a stacked structure of ITO/Mg, ITO/MgF, ITO/Ag or ITO/Ag/ITO, but is not limited thereto.

The pixel defining layer PDL may be disposed on the third pixel electrode PXE3. The pixel defining layer PDL may include an opening partially exposing the third pixel electrode PXE3. The pixel defining layer PDL may partially cover the third pixel electrode PXE3 and the via layer 165.

The pixel defining layer PDL may be formed of an organic insulating material or an inorganic insulating material. For example, the pixel defining layer PDL may include at least one of polyimide resin, acrylic resin, a silicon compound, or polyacrylic resin.

The light emitting layer EML may be disposed on the third pixel electrode PXE3 exposed by the pixel defining layer PDL. At least a part of the light emitting layer EML may be disposed in the opening of the pixel defining layer PDL. The light emitting layer EML may partially cover a top surface of the pixel defining layer PDL and a side surface of the pixel defining layer PDL forming an opening.

The light emitting layer EML may include an organic layer made of an organic material. The organic layer may include an organic light emitting layer, and may further include a hole injection/transport layer and an electron injection/transport layer.

As described above, the light emitting layer EML may fill the inside of the slit OP disposed between the extension portions PXE3a adjacent to each other of the third pixel electrode PXE3. The inside of the slit OP may be filled with the light emitting layer EML made of an organic material, so that when the display panel 100 is folded, stress applied to the third pixel electrode PXE3 disposed in the folding area FDA may be reduced.

In addition, referring to FIG. 8, the fourth and fifth pixel electrodes PXE4 and PXE5 may have the same structure as the third pixel electrode PXE3, so that when the display panel 100 is folded, stress applied to the fourth and fifth pixel electrodes PXE4 and PXE5 may be reduced.

The common electrode CME may be disposed on the light emitting layer EML. The common electrode CME may be extended across all the pixels PX. The common electrode CME may be a cathode electrode.

The common electrode CME may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The common electrode CME may further include a transparent metal oxide layer disposed on the material layer having a low work function.

The third pixel electrode PXE3, the light emitting layer EML, and the common electrode CME may constitute a light emitting element EMD. The light emitting element EMD may be, for example, an organic light emitting element. In one embodiment, a wavelength of light emitted by the light emitting element EMD may be constant for each pixel PX. In another embodiment, the wavelength of light emitted by each light emitting layer EML may be different for each color pixel PX, and thus a color of light emitted may be different. For example, the light emitting layer EML of the first color pixel PX may emit light of a first color, the light emitting layer EML of the second color pixel PX may emit light of a second color, and the light emitting layer EML of the third color pixel PX may emit light of a third color.

The thin film encapsulation layer 170 may be disposed on the common electrode CME. The thin film encapsulation layer 170 may include a first inorganic layer 171, a first organic layer 172 disposed on the first inorganic layer 171, and a second inorganic layer 173 disposed on the first organic layer 172. Although not illustrated, the first inorganic layer 171 and the second inorganic layer 173 may be in contact with each other at the end of the thin film encapsulation layer 170, so that the first organic layer 172 may be sealed by the first inorganic layer 171 and the second inorganic layer 173.

Each of the first inorganic layer 171 and the second inorganic layer 173 may include silicon nitride, silicon oxide, silicon oxynitride, or the like. The first organic layer 172 may include an organic insulating material.

As described above, in the folding area FDA of the display panel 100, the dummy hole DH penetrating the buffer layer 103, the second interlayer insulating layer 162, the third interlayer insulating layer 163, and the fourth interlayer insulating layer 164 may be disposed. The dummy hole DH may be disposed so as not to overlap the semiconductor layer 120 and the first to third conductive layers 130, 140, and 150. For example, there are a plurality of dummy holes DH, and the plurality of dummy holes DH may be disposed to surround the semiconductor patterns 121a, 121b, and 121c, the first gate electrode 131, the second gate electrode 141, the first source/drain electrode 151, and the second source/drain electrode 152.

As described above, the dummy hole DH may be filled with the via layer 165. The dummy hole DH penetrating the buffer layer 103, the second interlayer insulating layer 162, the third interlayer insulating layer 163, and the fourth interlayer insulating layer 164 may be disposed in the folding area FDA of the display panel 100, and the dummy hole DH may be filled with the via layer 165 formed by including an organic material, so that stress applied to the inorganic insulating layer such as the buffer layer 103, the second interlayer insulating layer 162, the third interlayer insulating layer 163, and the fourth interlayer insulating layer 164 during folding may be reduced.

Specifically, in the unfolded state, an inner width d2 of the dummy hole DH of the display panel 100 may decrease as going from the upper side to the lower side. In the unfolded state, the inner width d2 of each dummy hole DH may be substantially constant. An inner width d4 of the dummy hole DH when the display panel 100 is folded may be larger than the inner width d2 of the dummy hole DH during unfolding. Due to the via layer 165 filling the inside of the dummy hole DH, stress applied to the inorganic insulating layer such as the buffer layer 103, the second interlayer insulating layer 162, the third interlayer insulating layer 163, and the fourth interlayer insulating layer 164 of the display panel 100 during folding may be reduced.

Figure 11:
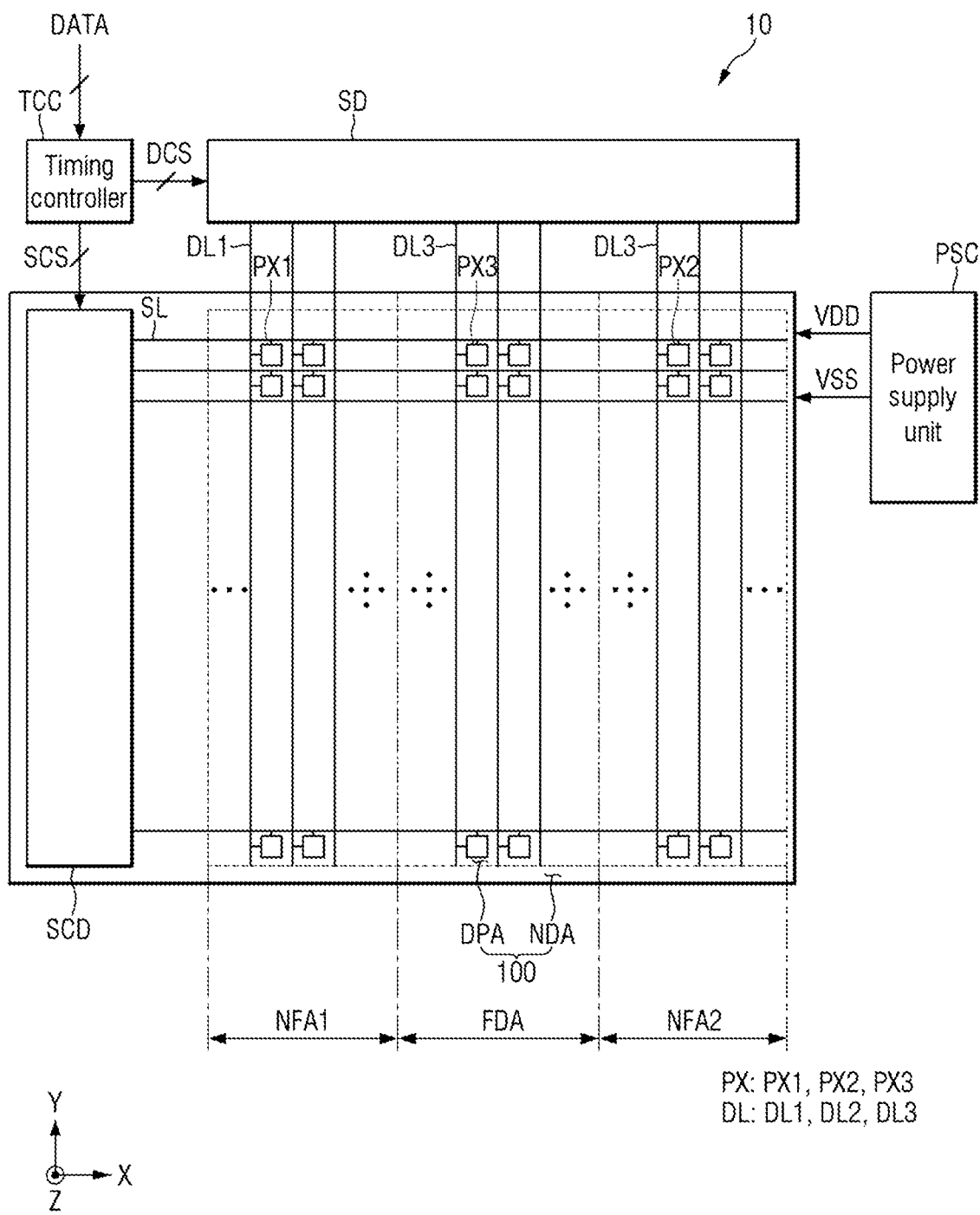
FIG. 11 is a block diagram of a display device according to one embodiment.

FIG. 11 is a block diagram of a display device according to one embodiment.

Referring to FIG. 11, the display device 10 includes the display panel 100, the scan driver SCD, a data driver SD, a timing controller TCC, and a power supply circuit PSC.

In the display area DPA of the display panel 100, not only the plurality of pixels PX, but also the plurality of scan wires SL and the plurality of data wires DL connected to the plurality of pixels PX may be disposed.

The plurality of scan wires SL may extend in the first direction X. The plurality of scan wires SL may be arranged along the second direction Y.

The plurality of data wires DL may extend in the second direction Y. The plurality of data wires DL may be arranged along the first direction X. As described above, the plurality of data wires DL may include a first data wire DL1 disposed in the first non-folding area NFA1, a second data wire DL2 disposed in the second non-folding area NFA2, and a third data wire DL3 disposed in the folding area FDA.

Each pixel PX may be connected to any one of the plurality of scan wires SL and any one of the plurality of data wires DL. As described above, the plurality of pixels PX may include the first pixel PX1 disposed in the first non-folding area NFA1, the second pixel PX2 disposed in the second non-folding area NFA2, and the third pixel PX3 disposed on the folding area FDA. The first pixel electrode PXE1 described above with reference to FIG. 8 may be disposed in the first pixel PX1, the second pixel electrode PXE2 may be disposed in the second pixel PX2, and the third pixel electrode PXE3 may be disposed in the third pixel PX3.

The scan driver SCD for applying scan signals to the plurality of scan wires SL may be disposed in the non-display area NDA of the display panel 100. FIG. 11 illustrates that the scan driver SCD is disposed on the edge of one side of the display panel 100, but is not limited thereto. The scan driver SCD may be disposed on the edges of both sides of the display panel 100.

The scan driver SCD may be connected to the timing controller TCC. The scan driver SCD may receive a scan control signal SCS from the timing controller TCC. The scan driver SCD may generate scan signals according to the scan control signal SCS to output the scan signals to the plurality of scan wires SL.

The timing controller TCC receives digital video data DATA and timing signals.

The timing controller TCC may generate the scan control signal SCS for controlling the operation timing of the scan driver SCD according to the timing signals, and may generate data control signal DCS for controlling the operation timing of the data driver SD.

The power supply circuit PSC may generate a plurality of driving voltages to output the driving voltages to the display panel 100 and the data driver SD. The power supply circuit PSC may output a first driving voltage VDD and a second driving voltage VSS to the display panel 100. The first driving voltage VDD may be a high potential driving voltage for driving the light emitting element of each of the sub-pixels, and the second driving voltage VSS may be a low potential driving voltage for driving the light emitting element of each of the sub-pixels.

A predetermined gamma voltage may be applied to the data wire DL to represent a specific gray scale in each pixel PX. The gamma voltage may be applied to the pixel electrode PXE of the pixel PX through the data wire DL connected to each pixel PX, and may be a voltage that determines the gray scale of the pixel PX. As the gamma voltage applied to the pixel electrode PXE of the specific pixel PX increases, the corresponding pixel PX may represent a higher gray scale.

In one embodiment, when the third pixel PX3 represents the same gray scale as the first and second pixels PX1 and PX2, the gamma voltage applied to the third pixel electrode PXE3 may be different from the gamma voltage applied to the first and second pixel electrodes PXE1 and PXE2.

For example, when the third pixel PX3 represents the same gray scale as the first and second pixels PX1 and PX2, the gamma voltage applied to the third pixel electrode PXE3 may be greater than the gamma voltage applied to the first and second pixel electrodes PXE1 and PXE2. As described above with reference to FIG. 8, the third pixel electrode PXE3 includes the slit OP, so that when a gamma voltage equal to the gamma voltage applied to the first and second pixel electrodes PXE1 and PXE2 is applied to the third pixel electrode PXE3, the third pixel PX3 may represent a lower gray scale than the first and second pixels PX1 and PX2. Accordingly, in order to compensate for this, a gamma voltage higher than the gamma voltage applied to the first and second pixel electrodes PXE1 and PXE2 may be preferably applied to the third pixel electrode PXE3 of the third pixel PX3 as described above.

In addition, in order for the third pixel PX3 to represent the same gray scale in the folded state and the unfolded state of the display panel 100, a folding gamma voltage applied to the third pixel electrode PXE3 in the folded state of the display panel 100 may be different from the unfolding gamma voltage applied to the third pixel electrode PXE3 in the unfolded state of the display panel 100.

For example, in order for the third pixel PX3 to represent the same gray scale in the folded state and the unfolded state of the display panel 100, a folding gamma voltage applied to the third pixel electrode PXE3 in the folded state of the display panel 100 may be greater than the unfolding gamma voltage applied to the third pixel electrode PXE3 in the unfolded state of the display panel 100.

As described above with reference to FIGS. 9 and 10, the distance d3 between the extension portions PXE3a adjacent to each other, which is the same as the width of the slit OP in the folded state of the display panel 100, may be greater than the distance d1 between the extension portions PXE3a adjacent to each other, which is the same as the width of the slit OP in the unfolded state of the display panel 100. That is, when the display panel 100 is folded, the slit OP, which is an empty space in the third pixel electrode PXE3, may increase. Accordingly, in order for the third pixel PX3 to represent the same gray scale in the folded state and the unfolded state of the display panel 100, the folding gamma voltage may preferably be greater than the unfolding gamma voltage.

However, the embodiment is not limited thereto, and the folding gamma voltage applied to the third pixel electrode PXE3 in the folded state of the display panel 100 and the unfolding gamma voltage applied to the third pixel electrode PXE3 in the unfolded state of the display panel 100 may be the same.

The display device 10 according to one embodiment may include the third pixel electrode PXE3 that is disposed in the folding area FDA and patterned in a shape including the extension portion PXE3a and the connection portion PXE3b, so that stress applied to the third pixel electrode PXE3 during folding may be reduced.

As described above, in the display device 10 according to one embodiment, the third pixel electrode PXE3 of the third pixel PX3 disposed in the folding area FDA may represent a smaller surface area than the surface areas of the first and second pixel electrodes PXE1 and PXE2. Accordingly, due to the relatively small surface area of the third pixel electrode PXE3, when the same voltage is applied to the first to third pixel electrodes PXE1, PXE2, and PXE3, the third pixel PX3 may represent a gray scale lower than the gray scales of the first and second pixels PX1 and PX2.

The display device 10 may set a gamma voltage applied to the third pixel PX3 disposed in the folding area FDA, higher than a gamma voltage applied to the first and second pixels PX1 and PX2 disposed in the first non-folding area NFA1 and the second non-folding area NFA2, so that the gray scale of the third pixel electrode PXE3 may be compensated.

In addition, the folding scan wire portion SLc of the scan wire SL may include the plurality of scan openings SLH filled with an organic material, so that stress applied to the scan wire SL may be reduced when the display panel 100 is folded. The third data wire DL3 may include the plurality of data openings DLH filled with an organic material, so that stress applied to the third data wire DL3 disposed in the folding area FDA may be reduced when the display panel 100 is folded.

Hereinafter, another embodiment of the display device 10 will be described. In the following embodiments, a description of the same components as those of the above-described embodiment will be omitted or simplified for ease in explanation of these embodiments, and differences will be mainly described.

Figure 12:
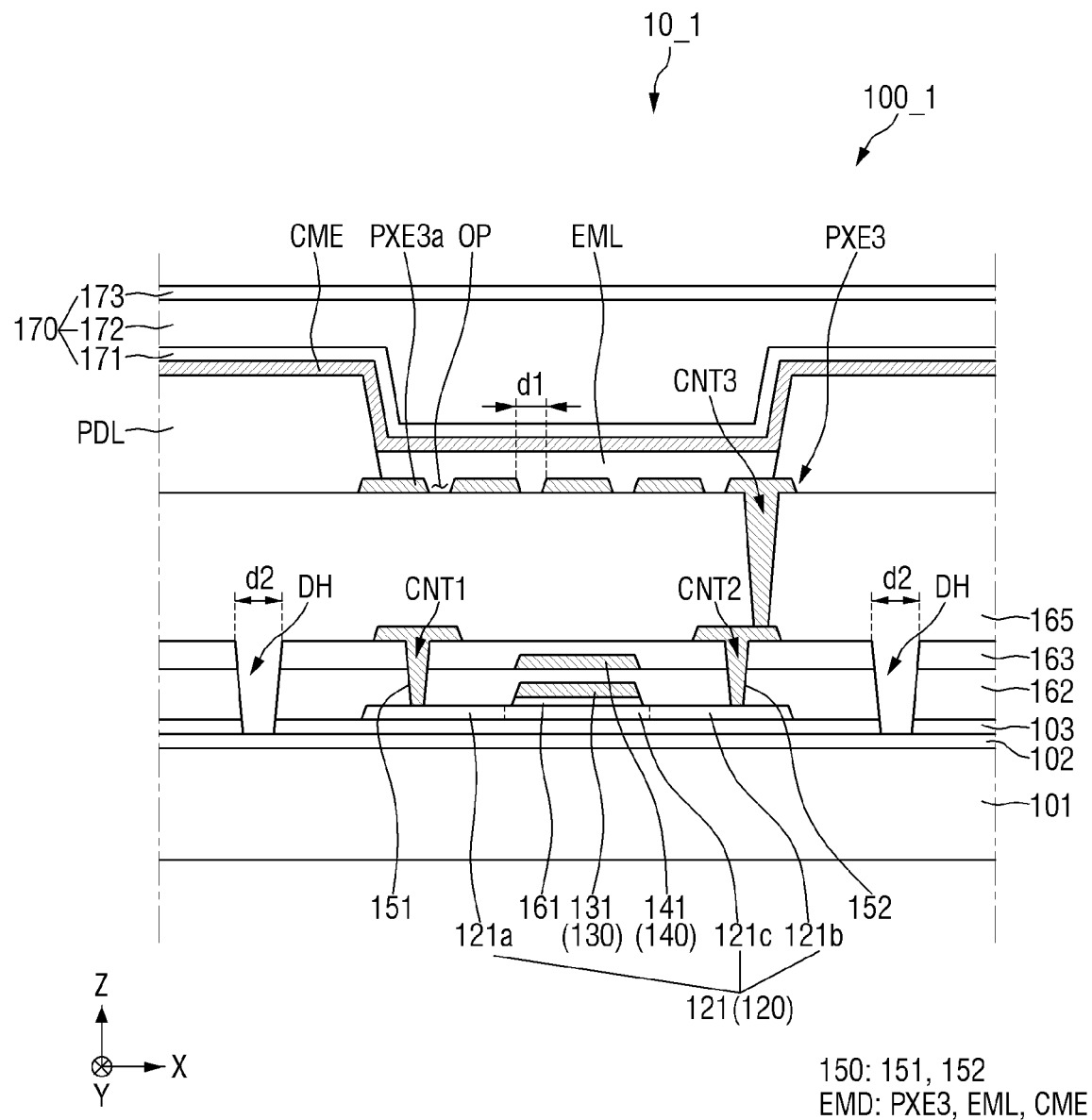
FIG. 12 is a cross-sectional view of a folding area of a display panel according to another embodiment.

FIG. 12 is a cross-sectional view of a folding area of a display panel according to another embodiment.

Referring to FIG. 12, in the embodiment described with reference to that figure, a display panel 100_1 is different from the display panel 100 according to one embodiment in that the fourth interlayer insulating layer 164 is omitted for ease in explanation of the embodiment.

In the embodiment described with reference to FIG. 12, the via layer 165 may be disposed on the first source/drain electrode 151 and the second source/drain electrode 152. The third pixel electrode PXE3 may be electrically connected to the second source/drain electrode 152 through the third contact hole CNT_3 penetrating the via layer 165. In addition, a dummy hole DH may penetrate the buffer layer 103, the second interlayer insulating layer 162, and the third interlayer insulating layer 163.

In the display panel 100_1 according to the embodiment described herein, the number and thickness of inorganic layers disposed between the barrier layer 102 and the via layer 165 may decrease compared to the display panel 100 according to one embodiment. Due to the high hardness of the inorganic material, as the thickness and number of the inorganic layers made of the inorganic material decrease, the stress applied to the inorganic layer when the display panel 100_1 is folded may be reduced.

The display device 10_1 according to the embodiment described herein may include the third pixel electrode PXE3 that is disposed in the folding area FDA and patterned in a shape including the extension portion PXE3a and the connection portion PXE3b, so that stress applied to the third pixel electrode PXE3 during folding may be reduced.

In the display device 10_1 according to the embodiment described herein, the third pixel electrode PXE3 of the third pixel PX3 disposed in the folding area FDA may represent a smaller surface area than the surface areas of the first and second pixel electrodes PXE1 and PXE2 disposed in the non-folding areas NFA1 and NFA2. Accordingly, due to the relatively small surface area of the third pixel electrode PXE3, when the same voltage is applied to the first to third pixel electrodes PXE1, PXE2, and PXE3, the third pixel PX3 may represent a gray scale lower than the gray scales of the first and second pixels PX1 and PX2.

The display device 10_1 may set a gamma voltage applied to the third pixel PX3 disposed in the folding area FDA, higher than a gamma voltage applied to the first and second pixels PX1 and PX2 disposed in the first non-folding area NFA1 and the second non-folding area NFA2, so that the gray scale of the third pixel electrode PXE3 may be compensated.

In addition, the folding scan wire portion SLc of the scan wire SL may include the plurality of scan openings SLH filled with an organic material, so that stress applied to the scan wire SL may be reduced when the display panel 100_1 is folded. The third data wire DL3 may include the plurality of data openings DLH filled with an organic material, so that stress applied to the third data wire DL3 disposed in the folding area FDA may be reduced when the display panel 100_1 is folded.

Moreover, in the display panel 100_1 according to the embodiment described herein, the fourth interlayer insulating layer 164 is omitted, so that the number and thickness of inorganic layers disposed between the barrier layer 102 and the via layer 165 may decrease compared to the display panel 100 according to one embodiment. Accordingly, when the display panel 100 is folded, stress applied to the inorganic layer made of the inorganic material may be reduced.

Figure 13:
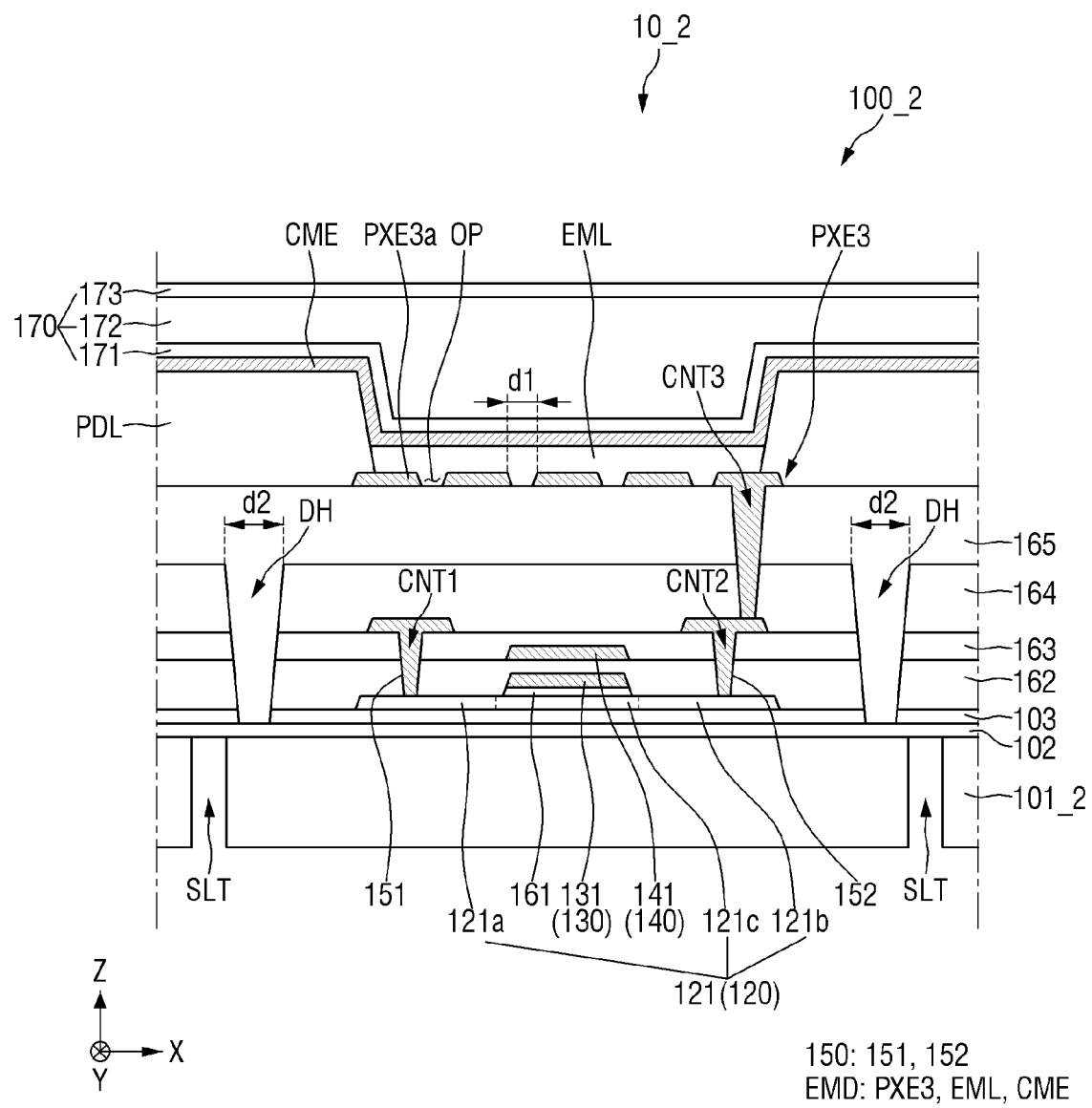
FIG. 13 is a cross-sectional view of a folding area of a display panel according to still another embodiment.
Figure 14:
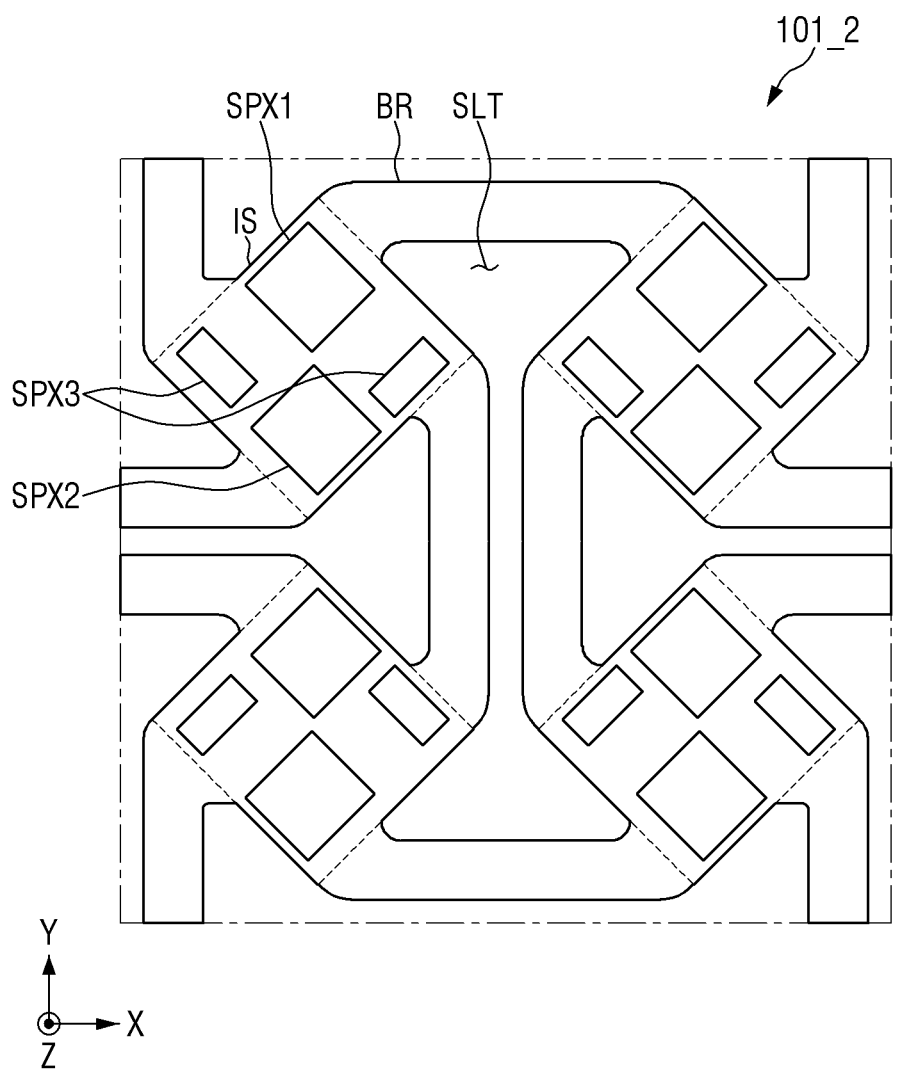
FIG. 14 is a plan view illustrating an unfolded state of the substrate of the display panel of FIG. 13.
Figure 15:
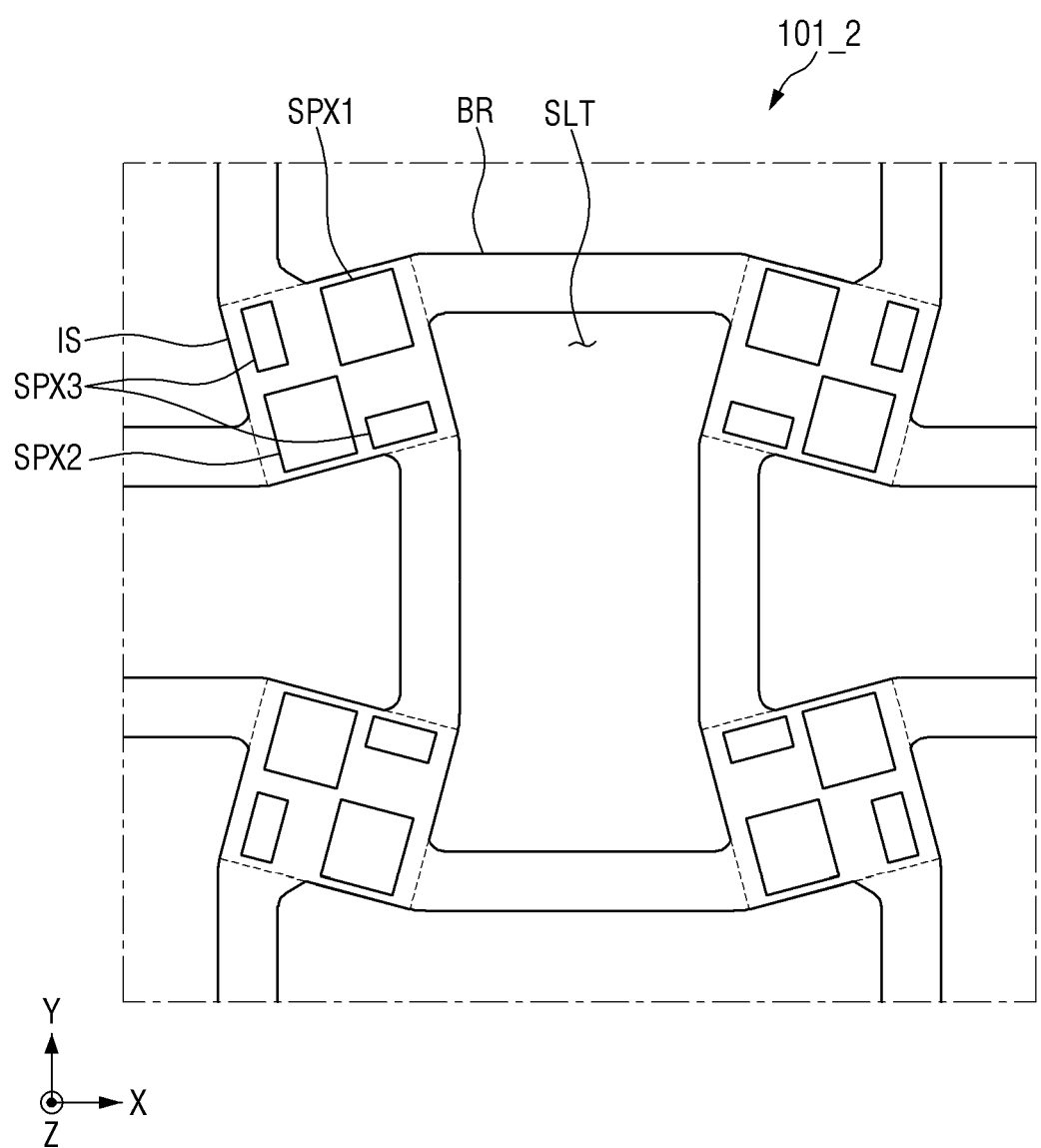
FIG. 15 is a plan view illustrating a folded state of the substrate of the display panel of FIG. 13.

FIG. 13 is a cross-sectional view of a folding area of a display panel according to still another embodiment. FIG. 14 is a plan view illustrating an unfolded state of the substrate of the display panel of FIG. 13. FIG. 15 is a plan view illustrating a folded state of the substrate of the display panel of FIG. 13.

Referring to FIGS. 13 to 15, a display device 10_2 according to the present embodiment is different from the display device 10 according to one embodiment in that a display panel 100_2 includes a substrate 101_2 that is different from the substrate 101 included in the display panel 100 according to one embodiment.

The substrate 101_2 may have a structure capable of stretching together when the display panel 100_2 is folded and partially stretched in the folding area FDA. That is, the display panel 100_2 may include the substrate 101_2 having a stretchable structure in the folding area FDA.

The substrate 101_2 may include a first segment disposed in the folding area FDA and a second segment disposed in the non-folding areas NFA1 and NFA2. Specifically, the substrate 101_2 in the folding area FDA, as the first segment, may include a plurality of island-like patterns IS and a plurality of bridge patterns BR connecting the plurality of island-like patterns adjacent to each other. In the non-folding areas NFA1 and NFA2, as the second segment, a material constituting the substrate 101_2 may be entirely disposed on the substrate 101_2. That is, a material constituting the substrate 101_2 may be entirely disposed in the non-folding areas NFA1 and NFA2 defined by the non-display area NDA and the folding area FDA.

The substrate 101_2 disposed in the folding area FDA may have an island structure. In the folding area FDA, the substrate 101_2 may include the plurality of island-like patterns IS and the plurality of bridge patterns BR connecting the island-like patterns IS adjacent to each other. Here, being adjacent to each other may mean a relationship between one island-like pattern IS and another island-like pattern IS disposed to be spaced apart by the shortest distance.

In the folding area FDA, the plurality of island-like patterns IS may be arranged along the first direction X and the second direction Y. The plurality of island-like patterns IS may be arranged in a matrix form. The island-like patterns IS adjacent to each other may be connected to each other through at least one bridge pattern BR.

Each island-like pattern IS is separated by a cutout portion SLT. The cutout portion SLT may be surrounded by the island-like pattern IS and the bridge pattern BR in plan view. The cutout portion SLT may penetrate the substrate 101_2 in the thickness direction. A material constituting the substrate 101_2 may not be present in the cutout portion SLT. The cutout portion SLT in which the constituent material of the substrate 101_2 does not exist may be deformed more freely in width for expansion and contraction than the portion filled with the constituent material of the substrate 101_2. Accordingly, when the substrate 101_2 partially expands or contracts, it easily expands and contracts by the cutout portion SLT, so that stress applied to the substrate 101_2 may be reduced.

Each island-like pattern IS may have a rectangular shape. The island-like pattern IS in the unfolded state illustrated in FIG. 14 illustrates that the four corners are disposed on one side and the other side of the first direction X and on one side and the other side of the second direction Y, but is not limited thereto. In addition, the shape of the island-like pattern IS may be variously modified into another polygonal shape, a circular shape, an elliptical shape, or the like.

The bridge pattern BR connecting the island-like pattern IS may have a shape extending in one direction.

One edge of one island-like pattern IS in the first direction X may be connected to the bridge pattern BR extending in one side or the other side of the second direction Y. Each of the bridge patterns BR extending from one edge of one island-like pattern IS in the first direction X to one side or the other side of the second direction Y may be connected to one edge of the island-like pattern IS in the first direction X disposed on one side or the other side of the second direction Y from one island-like pattern IS.

The other edge of one island-like pattern IS in the first direction X may be connected to the bridge pattern BR extending in one side or the other side of the second direction Y. Each of the bridge patterns BR extending from the other edge of one island-like pattern IS in the first direction X to one side or the other side of the second direction Y may be connected to the other edge of the island-like pattern IS in the first direction X disposed on one side or the other side of the second direction Y from one island-like pattern IS.

One edge of one island-like pattern IS in the second direction Y may be connected to the bridge pattern BR extending in one side or the other side of the first direction X. Each of the bridge patterns BR extending from one edge of one island-like pattern IS in the second direction Y to one side or the other side of the first direction X may be connected to one edge of the island-like pattern IS in the second direction Y disposed on one side or the other side of the first direction X from one island-like pattern IS.

The other edge of one island-like pattern IS in the second direction Y may be connected to the bridge pattern BR extending in one side or the other side of the first direction X. Each of the bridge patterns BR extending from the other edge of one island-like pattern IS in the second direction Y to one side or the other side of the first direction X may be connected to the other edge of the island-like pattern IS in the second direction Y disposed on one side or the other side of the first direction X from one island-like pattern IS.

A structure of the pixel PX such as the thin film transistor TFT and the light emitting element EMD may be disposed on each island-like pattern IS. One pixel PX may be disposed on each island-like pattern IS. One pixel PX may include a plurality of sub-pixels SPX1, SPX2, and SPX3. The plurality of sub-pixels SPX1, SPX2, and SPX3 may include a first sub-pixel SPX1, a second sub-pixel SPX2, and a third sub-pixel SPX3. The first sub-pixel SPX1 and the second sub-pixel SPX2 may have the same size, and the third sub-pixel SPX3 may have a smaller size than the sizes of the first sub-pixel SPX1 and the second sub-pixel SPX2. For example, the first sub-pixel SPX1 may be a red pixel, the second sub-pixel SPX2 may be a blue pixel, and the third sub-pixel SPX3 may be a green pixel, but the embodiment is not limited thereto.

Various wires for supplying a driving voltage, a data signal, a scan signal, or the like to the pixel PX may be formed on each bridge pattern BR. For example, the scan wire SL and the data wire DL may be formed on each bridge pattern BR.

As illustrated in FIG. 15, when the display panel 100_2 is folded with respect to the folding axis extending in the second direction Y and the substrate 101_2 is stretched, the distance between the island-like patterns IS adjacent to each other may change. For example, when the display panel 100_2 is folded with respect to a folding axis extending in the second direction Y and the substrate 101_2 is stretched in one side and the other side of the first direction X, each island-like pattern IS may be rotated by about 45° and the distance between the island-like patterns IS disposed adjacent to each other in the first direction X and the second direction Y may increase. In this case, the shape of each island-like pattern IS may not be deformed. That is, the width and height of the island-like pattern IS may not increase or decrease. Accordingly, the structure of the pixel PX disposed on the island-like pattern IS may not also be deformed.

However, when the display panel 100_2 is folded and the substrate 101_2 is stretched, the plurality of bridge patterns BR connecting the island-like pattern IS may be deformed. For example, when the display panel 100_2 is folded with respect to a folding axis extending in the second direction Y and the substrate 101_2 is stretched in one side and the other side of the first direction X, the bridge pattern BR extending in the first direction X may be partially stretched, and the bridge pattern BR extending in the second direction Y may be bent.

Stress applied to various conductive layers and inorganic layers constituting the pixel PX disposed on the island-like pattern IS when the display panel 100_2 is folded, may be reduced through the substrate 101_2 including the plurality of island-like patterns IS and the plurality of bridge patterns BR. Specifically, stress applied to the thin film transistor TFT and the light emitting element EMD disposed on the island-like pattern IS, may be reduced.

The display device 10_2 according to the present embodiment may include the third pixel electrode PXE3 that is disposed in the folding area FDA and patterned in a shape including the extension portion PXE3a and the connection portion PXE3b, so that stress applied to the third pixel electrode PXE3 during folding may be reduced.

In the display device 10_2 according to the embodiment described herein, the third pixel electrode PXE3 of the third pixel PX3 disposed in the folding area FDA may represent a smaller surface area than the surface areas of the first and second pixel electrodes PXE1 and PXE2 disposed in the non-folding areas NFA1 and NFA2. Accordingly, due to the relatively small surface area of the third pixel electrode PXE3, when the same voltage is applied to the first to third pixel electrodes PXE1, PXE2, and PXE3, the third pixel PX3 may represent a gray scale lower than the gray scales of the first and second pixels PX1 and PX2.

The display device 10_2 may set a gamma voltage applied to the third pixel PX3 disposed in the folding area FDA, higher than a gamma voltage applied to the first and second pixels PX1 and PX2 disposed in the first non-folding area NFA1 and the second non-folding area NFA2, so that the gray scale of the third pixel electrode PXE3 may be compensated.

In addition, the folding scan wire portion SLc of the scan wire SL may include the plurality of scan openings SLH filled with an organic material, so that stress applied to the scan wire SL may be reduced when the display panel 100_2 is folded. The third data wire DL3 may include the plurality of data openings DLH filled with an organic material, so that stress applied to the third data wire DL3 disposed in the folding area FDA may be reduced when the display panel 100_2 is folded.

Moreover, the display device 10_2 according to the embodiment described herein may include the display panel 100_2 having a stretchable structure. Specifically, the display panel 100_2 may include the substrate 101_2 having a structure that may be stretched together when the substrate 101 is partially stretched during folding. Accordingly, the display device 10_2 according to the embodiment described herein may reduce stress applied to the thin film transistor TFT and the light emitting element EMD when the display panel 100_2 is folded, through the substrate 101_2 having a stretchable structure.

Figure 16:
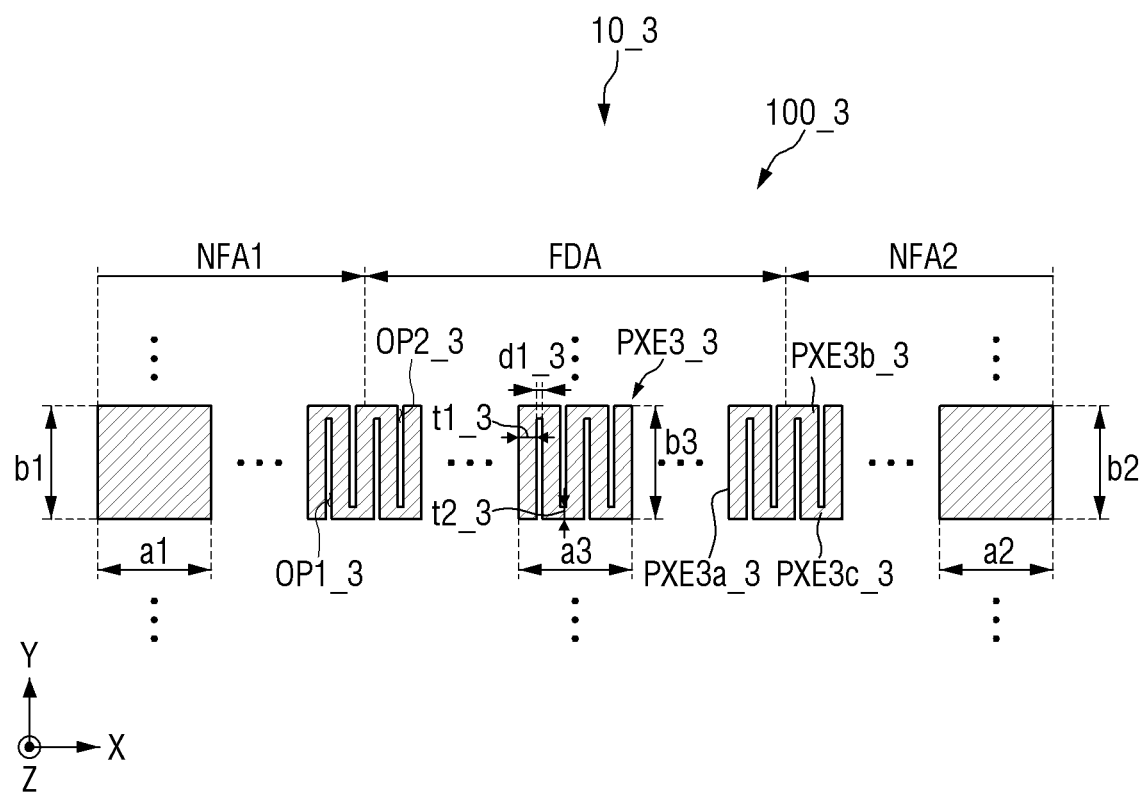
FIG. 16 is a layout diagram of pixel electrodes of a display panel according to another embodiment.

FIG. 16 is a layout diagram of pixel electrodes of a display panel according to another embodiment.

The display device 10_3 according to the present embodiment is different in that the planar shape of a third pixel electrode PXE3_3 disposed in the folding area FDA is different from the planar shape of the third pixel electrode PXE3 of the display device 10 according to one embodiment.

In the present embodiment, the third pixel electrode PXE3_3 may include a plurality of extension portions PXE3a_3 extending in the second direction Y and arranged in the first direction X, a first connection portion PXE3b_3 connecting one ends of the extension portions PXE3a_3 adjacent to each other in the second direction Y and extending in the first direction X, and a second connection portion PXE3c_3 connecting the other ends of the extension portions PXE3a_3 adjacent to each other in the second direction Y and extending in the first direction X. The first connection portions PXE3b_3 and the second connection portions PXE3c_3 may be alternately disposed.

That is, when one extension portion PXE3a_3 and another extension portion PXE3a_3 adjacent to one side of one extension portion PXE3a_3 in the first direction X are connected by the first connection portion PXE3b_3, one extension portion PXE3a_3 and another extension portion PXE3a_3 adjacent to the other side of one extension portion PXE3a_3 in the first direction X may be connected by the second connection portion PXE3c_3. Conversely, when one extension portion PXE3a_3 and another extension portion PXE3a_3 adjacent to one side of one extension portion PXE3a_3 in the first direction X are connected by the second connection portion PXE3c_3, one extension portion PXE3a_3 and another extension portion PXE3a_3 adjacent to the other side of one extension portion PXE3a_3 in the first direction X may be connected by the first connection portion PXE3b_3.

A width t1_3 of the extension portion PXE3a_3 may be greater than a width t2_3 of the first connection portion PXE3b_3 and a width t3_3 of the second connection portion PXE3c_3. The width t2_3 of the first connection portion PXE3b_3 and the width t3_3 of the second connection portion PXE3c_3 may be the same, but are not limited thereto and may be different. The width t1_3 of the extension portion PXE3a_3 may mean the length of the extension portion PXE3a_3 in the first direction X, and the width t2_3 of the first connection portion PXE3b_3 and the width t3_3 of the second connection portion PXE3c_3 may mean the length in the second direction Y of each of the first connection portion PXE3b_3 and the second connection portion PXE3c_3.

The distance d1_3 between the extension portions PXE3a_3 adjacent to each other may be smaller than the width t1_3 of the extension portions PXE3a_3. The distance d1_3 between the extension portions PXE3a_3 adjacent to each other may be greater than the width t2_3 of the first connection portion PXE3b_3 and the width t3_3 of the second connection portion PXE3c_3, but is not limited thereto.

In the embodiment described herein, the third pixel electrode PXE3_3 may include one or more openings disposed inside from an outermost edge defining an appearance. Specifically, the third pixel electrode PXE3_3 may further include a first slit OP1_3 surrounded by the first connection portion PXE3b_3 and the extension portions PXE3a_3 that are connected to the first connection portion PXE3b_3 and that are adjacent to each other, and a second slit OP2_3 surrounded by the second connection portion PXE3c_3 and the extension portions PXE3a_3 that are connected to the second connection portion PXE3c_3 and that are adjacent to each other. The first slit OP1_3 may open toward the other side of the second direction Y, and the second slit OP2_3 may open toward one side of the second direction Y. In the third pixel electrode PXE3_3 of the present embodiment, the first slit OP1_3 and the second slit OP2_3 may be alternately disposed.

The widths of the first slit OP1_3 and the second slit OP2_3 in the first direction X may be the same. The widths of the first slit OP1_3 and the second slit OP2_3 in the first direction X may be the same as the distance d1_3 between the extension portions PXE3a_3 adjacent to each other.

Since the first connection portion PXE3b_3 and the second connection portion PXE3c_3 of the third pixel electrode PXE3_3 according to the present embodiment are positioned in opposite directions with respect to the extension portion PXE3a_3 and are alternately positioned, stress applied to the connection portions PXE3b_3 and PXE3c_3 may be distributed when a display panel 100_3 is folded. When the stress applied during folding is distributed, damage to the third pixel electrode PXE3_3 may be minimized.

The display device 10_3 according to the present embodiment may include the third pixel electrode PXE3_3 that is disposed in the folding area FDA and patterned in a shape including the extension portion PXE3a_3, the first connection portion PXE3b_3, and the second connection portion PXE3c_3, so that stress applied to the third pixel electrode PXE3_3 during folding may be reduced.

In the display device 10_3 according to the present embodiment, the third pixel electrode PXE3_3 of the third pixel PX3 disposed in the folding area FDA may represent a smaller surface area than the surface areas of the first and second pixel electrodes PXE1 and PXE2 disposed in the non-folding areas NFA1 and NFA2. Accordingly, due to the relatively small surface area of the third pixel electrode PXE3, when the same voltage is applied to the first to third pixel electrodes PXE1, PXE2, and PXE3_3, the third pixel PX3 may represent a gray scale lower than the gray scales of the first and second pixels PX1 and PX2.

The display device 10_3 may set a gamma voltage applied to the third pixel PX3 disposed in the folding area FDA, higher than a gamma voltage applied to the first and second pixels PX1 and PX2 disposed in the first non-folding area NFA1 and the second non-folding area NFA2, so that the gray scale of the third pixel electrode PXE3_3 may be compensated.

In addition, the folding scan wire portion SLc of the scan wire SL may include the plurality of scan openings SLH filled with an organic material, so that stress applied to the scan wire SL may be reduced when the display panel 100_3 is folded. The third data wire DL3 may include the plurality of data openings DLH filled with an organic material, so that stress applied to the third data wire DL3 disposed in the folding area FDA may be reduced when the display panel 100_3 is folded.

Moreover, the display panel 100_3 according to the embodiment described herein may minimize the occurrence of damage to the third pixel electrode PXE3_3 by distributing stress applied to the third pixel electrode PXE3_3 when the display panel 100_3 is folded, through the third pixel electrode PXE3_3 that is disposed in the folding area FDA and patterned in a shape including the extension portion PXE3a_3, the first connection portion PXE3b_3, and the second connection portion PXE3c_3.

Figure 17:
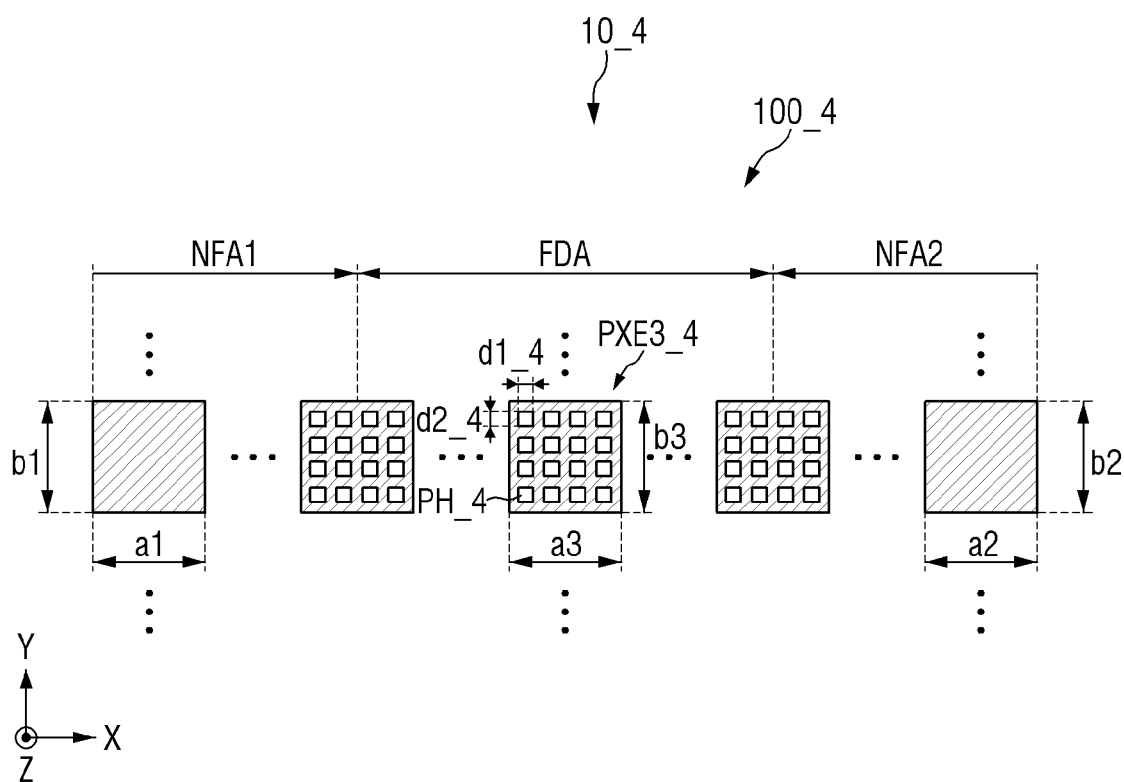
FIG. 17 is a layout diagram of pixel electrodes of a display panel according to still another embodiment.

FIG. 17 is a layout diagram of pixel electrodes of a display panel according to still another embodiment.

Referring to FIG. 17, a display device 10_4 according to the embodiment described with reference to that figure is different in that the planar shape of a third pixel electrode PXE3_4 disposed in the folding area FDA is different from the planar shape of the third pixel electrode PXE3 of the display device 10 according to one embodiment.

In the embodiment described herein, the external appearance of the third pixel electrode PXE3_4 may have a rectangular shape in plan view. A length a3_4 in the first direction X and a length b3_4 in the second direction Y of the third pixel electrode PXE3_4 may be the same, but are not limited thereto and may be different. In addition, the external appearance of the third pixel electrode PXE3_4 may have another polygonal, circular, or elliptical shape in plan view.

In the embodiment described herein, the third pixel electrode PXE3_4 may include one or more openings disposed inside from an outermost edge defining an appearance. Specifically, the third pixel electrode PXE3_4 may include a plurality of pixel holes PH_4 disposed therein. The plurality of pixel holes PH_4 may be arranged in a matrix shape along the first direction X and the second direction Y. That is, the third pixel electrode PXE3_4 according to the embodiment described herein may have a mesh structure.

Each pixel hole PH_4 may have a rectangular shape in plan view. When the folding area FDA extends along the second direction Y, a length d1_4 of each pixel hole PH_4 in the first direction X may be preferably smaller than a length d2_4 in the second direction Y to reduce stress applied to the third pixel electrode PXE3_4 when the display panel 100_4 is folded. However, the embodiment is not limited thereto, and the length d1_4 of each pixel hole PH_4 in the first direction X may be greater than or equal to the length d2_4 in the second direction Y.

In addition, the pixel hole PH_4 may have another polygonal shape, a circular shape, or an elliptical shape in plan view.

In the embodiment described herein, the third pixel electrode PXE3_4 may distribute stress applied to the third pixel electrode PXE3_4 when the display panel 100_3 is folded, through a structure including the plurality of pixel holes PH_4.

The display device 10_4 according to the embodiment described herein may include the third pixel electrode PXE3_4 that is disposed in the folding area FDA and patterned in a shape including the plurality of pixel holes PH_4, so that stress applied to the third pixel electrode PXE3_4 during folding may be reduced.

In the display device 10_4 according to the embodiment described herein, the third pixel electrode PXE3_4 of the third pixel PX3 disposed in the folding area FDA may represent a smaller surface area than the surface areas of the first and second pixel electrodes PXE1 and PXE2 disposed in the non-folding areas NFA1 and NFA2. Accordingly, due to the relatively small surface area of the third pixel electrode PXE3, when the same voltage is applied to the first to third pixel electrodes PXE1, PXE2, and PXE3_4, the third pixel PX3 may represent a gray scale lower than the gray scales of the first and second pixels PX1 and PX2.

The display device 10_4 may set a gamma voltage applied to the third pixel PX3 disposed in the folding area FDA, higher than a gamma voltage applied to the first and second pixels PX1 and PX2 disposed in the first non-folding area NFA1 and the second non-folding area NFA2, so that the gray scale of the third pixel electrode PXE3_4 may be compensated.

In addition, the folding scan wire portion SLc of the scan wire SL may include the plurality of scan openings SLH filled with an organic material, so that stress applied to the scan wire SL may be reduced when the display panel 100_4 is folded. The third data wire DL3 may include the plurality of data openings DLH filled with an organic material, so that stress applied to the third data wire DL3 disposed in the folding area FDA may be reduced when the display panel 100_4 is folded.

Moreover, the display panel 100_4 according to the embodiment described herein may minimize the occurrence of damage to the third pixel electrode PXE3_4 by distributing stress applied to the third pixel electrode PXE3_4 when the display panel 100_4 is folded, through the third pixel electrode PXE3_4 that is disposed in the folding area FDA and patterned in a shape including the plurality of pixel holes PH_4.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate including a folding area and a non-folding area disposed adjacent to the folding area; and
a plurality of pixel electrodes disposed on the substrate,
wherein the plurality of pixel electrodes includes a first pixel electrode disposed in the folding area and a second pixel electrode disposed in the non-folding area,
the first pixel electrode includes one or more openings positioned in an interior of the first pixel electrode with respect to an outermost edge of the first pixel electrode,
the display device further comprising:
an inorganic insulating layer disposed between the substrate and the pixel electrodes and including a dummy hole at least partially penetrating to an inside of the folding area, and
an organic insulating layer disposed on the insulating layer and configured to fill an inside of the dummy hole, and
the first pixel electrode is disposed on the organic insulating layer.

2. The display device of claim 1, wherein the first pixel electrode includes a plurality of openings, wherein each of the plurality of openings includes a slit connected from the outermost edge to thereby have the first pixel electrode form a comb-like structure.

3. The display device of claim 2, wherein each of the plurality of openings includes a hole surrounded by a material forming the first pixel electrode.

4. The display device of claim 1, wherein a surface area of the first pixel electrode is smaller than a surface area of the second pixel electrode.

5. The display device of claim 4, wherein when a first pixel on which the first pixel electrode is disposed and a second pixel on which the second pixel electrode is disposed represent a same gray scale, and
a first gamma voltage applied to the first pixel electrode is greater than a second gamma voltage applied to the second pixel electrode.

6. The display device of claim 1, wherein the folding area extends in a first direction, and the non-folding area is disposed on one side and the other side of the folding area in a second direction crossing the first direction, and
the first pixel electrode includes a plurality of extension portions extending in the first direction and a connection portion connecting the plurality of extension portions adjacent to each other in the second direction.

7. The display device of claim 6, wherein a width of each of the extension portions is greater than a width of the connection portion.

8. The display device of claim 6, wherein the substrate is configured to be folded around a folding axis extending in the first direction, and
a distance between the plurality of extension portions adjacent to each other in a folded state of the substrate is greater than a distance between the plurality of extension portions adjacent to each other in an unfolded state of the substrate.

9. The display device of claim 1, wherein the folding area extends in a first direction, and the non-folding area is disposed on one side and the other side of the folding area in a second direction crossing the first direction,
the substrate is configured to be folded around a folding axis extending in the first direction, and
an inner width of the dummy hole in a folded state of the substrate is greater than an inner width of the dummy hole in an unfolded state of the substrate.

10. The display device of claim 1, wherein the folding area extends in a first direction, and the non-folding area is disposed on one side and the other side of the folding area in a second direction crossing the first direction,
the display device further comprising:
a plurality of first wires disposed on the substrate and extending in the first direction; and
a plurality of second wires disposed on the substrate and extending in the second direction,
wherein the plurality of first wires includes a first folding wire disposed in the folding area and a first non-folding wire disposed in the non-folding area, and
the first folding wire includes a plurality of first wire holes penetrating to inside of the first folding wire.

11. The display device of claim 10, wherein each of the second wires includes a folding wire portion disposed in the folding area and a non-folding wire portion disposed in the non-folding area, and
the folding wire portion includes a plurality of second wire holes penetrating to an inside of the second wires.

12. A display device comprising:
a substrate including a folding area and a non-folding area disposed adjacent to the folding area; and
a plurality of pixel electrodes disposed on the substrate,
wherein the plurality of pixel electrodes includes a first pixel electrode disposed in a first pixel disposed in the folding area, and a second pixel electrode disposed in a second pixel disposed in the non-folding area,
wherein the first pixel and the second pixel represent a same gray scale,
wherein a first gamma voltage applied to the first pixel electrode is different from a second gamma voltage applied to the second pixel electrode,
the display device further comprising:
an inorganic insulating layer disposed between the substrate and the pixel electrodes and including a dummy hole at least partially penetrating to an inside of the folding area, and
an organic insulating layer disposed on the insulating layer and configured to fill an inside of the dummy hole, and
the first pixel electrode is disposed on the organic insulating layer.

13. The display device of claim 12, wherein the folding area extends in a first direction, and the non-folding area is disposed on one side and the other side of the folding area in a second direction crossing the first direction, and
the substrate is configured to be folded around a folding axis extending in the first direction.

14. The display device of claim 13, wherein the first gamma voltage is greater than the second gamma voltage.

15. The display device of claim 12, wherein the folding area extends in a first direction, and the non-folding area is disposed on one side and the other side of the folding area in a second direction crossing the first direction, and the first pixel electrode includes a plurality of extension portions extending in the first direction and a connection portion connecting the plurality of extension portions adjacent to each other in the second direction.

16. The display device of claim 12, wherein a surface area of the first pixel electrode is smaller than a surface area of the second pixel electrode.

17. A display device comprising:

a substrate including a folding area and a non-folding area disposed adjacent to the folding area; and a plurality of pixel electrodes disposed on the substrate, wherein the plurality of pixel electrodes includes a first pixel electrode disposed in the folding area and a second pixel electrode disposed in the non-folding area, the first pixel electrode includes one or more openings positioned in an interior of the first pixel electrode with respect to an outermost edge of the first pixel electrode, the second pixel electrode does not include any opening positioned in an interior of the second pixel electrode with respect to an outermost edge of the second pixel electrode.

* * * * *